(12) United States Patent
Figueroa Saavedra

(10) Patent No.: US 12,488,906 B2
(45) Date of Patent: Dec. 2, 2025

(54) DEVICE FOR CONCENTRATING IONIZING RADIATION FLUENCE, WHICH FOCUSES ELECTRONS AND X-RAY PHOTONS AND IS ADAPTABLE

(71) Applicant: UNIVERSIDAD DE LA FRONTERA, Temuco (CL)

(72) Inventor: Rodolfo Gabriel Figueroa Saavedra, Temuco (CL)

(73) Assignee: UNIVERSIDAD DE LA FRONTERA, Temuco (CL)

( * ) Notice: Subject to any disclaimer, the term of this patent is extended or adjusted under 35 U.S.C. 154(b) by 1318 days.

(21) Appl. No.: 17/263,794

(22) PCT Filed: Jul. 26, 2019

(86) PCT No.: PCT/IB2019/056419
§ 371 (c)(1),
(2) Date: Jan. 27, 2021

(87) PCT Pub. No.: WO2020/021516
PCT Pub. Date: Jan. 30, 2020

(65) Prior Publication Data
US 2021/0287825 A1   Sep. 16, 2021

(30) Foreign Application Priority Data

Jul. 27, 2018  (WO) .................. PCT/IB2018/055616

(51) Int. Cl.
*G21K 1/093* (2006.01)
*A61N 5/10* (2006.01)
(Continued)

(52) U.S. Cl.
CPC ........... *G21K 1/093* (2013.01); *A61N 5/1049* (2013.01); *A61N 5/1077* (2013.01); *G21K 1/02* (2013.01);
(Continued)

(58) Field of Classification Search
CPC ............ G21K 1/093; G21K 1/02; G21K 5/00; G21K 5/04; A61N 5/1049; A61N 5/1077;
(Continued)

(56) References Cited

U.S. PATENT DOCUMENTS

| 4,134,017 A | * | 1/1979 | Azam | ...................... | A61N 5/10 250/398 |
| 2009/0020711 A1 | * | 1/2009 | Hansmann | ............... | A61N 5/10 250/492.3 |

(Continued)

FOREIGN PATENT DOCUMENTS

| AR | 086472 A1 | 12/2013 |
| KR | 20130039448 A | 4/2013 |
| WO | 2015102680 A2 | 7/2015 |

OTHER PUBLICATIONS

International Search Report and Written Opinion for Corresponding International Application No. PCT/IB2019/056419 dated Nov. 4, 2019; (16 Pages).

*Primary Examiner* — Michael Maskell
(74) *Attorney, Agent, or Firm* — LUCAS & MERCANTI, LLP

(57) ABSTRACT

A device for concentrating ionizing radiation fluence is disclosed having a coupling structure linking the external radiotherapy device with linear accelerator to an external structure, whose central axis is hollow with an input window through which electrons enter attaching to the rotation device; a rotation system linking the coupling structure with a coupling flange rotating an inner structure; a deflection system in the inner structure, wherein the deflection system has first and second magnetic deflection devices; a system for controlling the focal point, which is in the electron deflection system, having an electronic control system controlling a set of motors that produce coordinated movements of the second magnetic deflection device, a correction element and a collimator, which change the position of the focal point; and at least two laser diodes on the edge of the (Continued)

collimator pointing towards the focal point determining the position of the electron beam generated.

24 Claims, 25 Drawing Sheets

(51) Int. Cl.
*G21K 1/02* (2006.01)
*G21K 5/00* (2006.01)
*H05H 9/00* (2006.01)

(52) U.S. Cl.
CPC .......... *G21K 5/00* (2013.01); *A61N 2005/105* (2013.01); *A61N 2005/1089* (2013.01); *H05H 9/00* (2013.01)

(58) Field of Classification Search
CPC ..... A61N 2005/105; A61N 2005/1089; H05H 9/00; H05H 2007/045; H05H 2007/046; H05H 2277/11; H05H 7/04; H05H 9/048; H01J 35/116
USPC .......................................... 250/492.1–492.3
See application file for complete search history.

(56) References Cited

U.S. PATENT DOCUMENTS

| | | | |
|---|---|---|---|
| 2010/0012859 A1* | 1/2010 | Claereboudt | A61N 5/1043 250/492.3 |
| 2010/0301228 A1* | 12/2010 | Pu | A61N 5/1042 250/396 R |

* cited by examiner

A                    B

A                    B

A

B

DEVICE FOR CONCENTRATING IONIZING RADIATION FLUENCE, WHICH FOCUSES ELECTRONS AND X-RAY PHOTONS AND IS ADAPTABLE

CROSS REFERENCE TO RELATED APPLICATION

This Application is a 371 of PCT/IB2019/056419 filed on Jul. 26, 2019, which, in turn, claimed the priority of International Patent Application No. PCT/IB2018/055616 filed on Jul. 27, 2018, both applications are incorporated herein by reference.

TECHNICAL FIELD

The present invention relates to the radiotherapy industry. In particular, the present invention relates to a method and device that allows the radiation of electrons and/or X-ray photons to be concentrated in a given target, allowing the dose concentration focus to be guided and located continuously and less invasively, within a given area, without having the need to displace the patient, achieving an increase in efficacy to reach hard-to-reach tumors by reducing collateral damage in healthy organs.

BACKGROUND

External radiotherapy equipment using linear accelerators has different modalities and ways of applying radiation, either electron or X-ray photon radiation, characterized by having different degrees of freedom, associated with mechanical devices, to achieve a higher level of dose concentration in a given target or tumor. For this, in the case of X X-ray photons, the overlap of the radiation fields generated thanks to the movement of the gantry, the head and the treatment table is used, which implies a degree of freedom in rotation and 4 degrees of freedom due to the displacement of the treatment table, X, Y, Z and rotation. That is, 6 degrees of freedom. To this must be added that each field can change its shape and model its intensity thanks to a multi-sheet device.

When only the outline of the fields to be used is shaped and it is performed the overlap thereof it is called 3D radiotherapy, and this is still one of the most used until the date of submission of this application.

If, in addition to shaping the contours of the fields, the distribution of intensities in the section of the open field is modulated, this modality is called modulated intensity or IMRT, and nowadays it is a technique that is increasingly used in different radiotherapy centers in the world.

All of the above is done in the form of step and shoot, that is: a field is shoot, positioned, then another is shoot, and so on until all the shoots are completed with different positions, displacements and angles.

All this, even today, can be carried with live imaging systems that allow us to see what is being treated, that is, guided imaging radiotherapy and also with modulated intensity (IGRT) and the state of the art in this area could be classified as conceptually similar to the above, but in continuous or dynamic movement and is beginning to be used in many of the most advanced radiotherapy centers in the world as one of the most modern techniques so far and is known as volumetric arc therapy (VMAT). On the other hand, the equipment is no longer using the field flattening filters, since now differences in fluence can be corrected computationally and with the multi-sheets, so that the most modern equipment makes VMAT and also allows a greater delivery of doses per treatment time, in order to short the duration of these treatments.

All of the above means that as the techniques evolve, an improvement in the dose distribution deposited in the tumor is obtained by achieving it to be better shaped and distributed and with a higher dose concentration in the tumor and with less damage to the organs at risk.

On the other hand, modern radiotherapy equipment now also allows to be performed small field applications and simultaneously treat multiple small targets or metastases.

Judging from the above, traditional external radiotherapy equipment has reached a very high technological level and no new and significant developments such as those that have marked its evolution are envisage, however, it is still possible to continue improving the way in which treatments are applied in such a way that they are less invasive, more effective and even with fewer side effects.

There are various patents related to the deflection of electron beams, such as U.S. Pat. No. 6,181,771B1, which presents an X-ray source although it is true it has an emitter for the production of an electron beam and an anode in which the electron beam impinges on a focal point of X-rays or optical axis, and a system based on magnetic fields that produces a dipolar field and a quadrupole field, which together act to deflect and focus the electron beam on the target or optical axis; however, this US patent does not solve the technical problem of focusing and guiding the X-rays generated on the target, in summary it is very different from that proposed and does not concentrate the X-rays, as proposed in this invention.

Solution to Technical Problem and Applications

To amend the problem posed, a device or accessory external to the existing radiotherapy equipment and method is presented, which allows two degrees of additional freedom to concentrate the focus of electrons or X-rays continuously and less invasively at a point determined by the operator, without having the need to displace the patient, thereby obtaining a higher dual-dose concentration of electrons or X-ray photons and a better arrival of said electrons or X-ray photons to hard-to-reach tumors, and avoiding radiation in unwanted places, which generate harmful effects to patients. In addition, the present device does not require cooling systems.

The present device concentrates the dose to address various pathologies, such as arteriovenous malformations, cysts, benign tumors, deep (bone) infections, various ablations within the human or animal organism, as well as concentrating radiation within a certain material.

In its version of electron concentrator, it achieves to concentrate radiation in surface tumors (melanomas) or angioma and do a dose painting on said tumors, thus eliminating the need to use electron applicators based on Cerrobend moldings (low melting point metal used in radiotherapy mainly).

SUMMARY

The present device and method is able to capture the electron beam from a clinical use LINAC, deflecting it away from its optical axis or incidence line then closing it which generates an S-shaped trajectory that at its end points to the direction of the isocenter or focus. If this beam is impacted on a thin blank of a material of high atomic number, such as Wolfram or tungsten "W" or lead "Pb" X-ray photons are produced by Bremsstrahalung preferably emitted towards the isocenter, if these X-rays generated in the blank are collimated by a collimator pointing to the same isocenter, a narrow X-ray photon beam is achieved in the direction of the focus, or "beamlef" (thin parallel beam). The S-shaped trajectory of electrons is rotated with respect to the optical axis of the system with an angular velocity greater than 2% rad/s generating a cone of X-ray photon radiation in which the rotating beamlet always points to the isocenter, and cuts the optical axis there. This beamlet, when rotating the system, produces the overlap, and consequent concentration of fluence and dose in the zone of the isocenter.

By applying this radiation cone, produced dynamically by the rotating beamlet to a water phantom (water cube that simulates human tissue), so that the area of the isocenter of the rotation cone remains inside it, previous studies (1, 2) have shown that a higher dose deposit is achieved in the isocenter and low dose levels in the entry zone of the radiation cone, similar to the effect achieved with the converging beam device patented by the same author (3).

The fundamental difference of this innovation, compared to the previous ones, lies in the way in which the control of the electron beam is achieved and the great adaptability of the present device to existing equipment, generating an accessory of great utility and low consumption, since its capacity adds all the benefits of existing equipment, by concentrating the dose even more on the tumor and decreasing it further in healthy tissues, thus highlighting what is provided with a new element, which will be of great commercial interest to competing companies.

Although today there are several commercial X-ray devices of essentially divergent beams, and there are other converging X-ray devices, capable of generating an approximately converging beam thanks to two main mechanisms; one of them by means of a system formed by a set of concentric circular multilayer mirrors, others thanks to small refractions in metallic materials (total internal reflection, possible for energies around 50 keV) that can generate a small deflection, all of them of low energy far below those used in linear accelerators, are neither adaptable to a LINAC nor manage to solve the technical problem posed.

The technical problem to be solved is the incorporation of a converging device in the head output of a linear electron accelerator for clinical use (LINAC), with minimal intervention. Unlike what is known in the prior art, the present device and method has a greater efficiency and effectiveness than those of a form that maximizes production and a target that does not need water cooling, which self-cools by air due to rotational movement thanks to conductive heat-exchanger plates that surround the dissipative shielding associated with the target. Another characteristic of existing devices, is that these can be built with X-ray mirrors, based on monocrystals and only reach about 50 keV, in the present device can have a higher energy range also starting also from low energies, for the generation of soft X-rays (20-50 keV) to ortho-voltage energy (100-500 keV). The latter range allows for more penetrating X-rays and with a higher production rate of X-ray photons than those in the low energy range.

Conventional X-ray generators are formed by an electron emitting device and a point target which in turn is the anode, in the case of the present device it is formed essentially by three elements: a system of adaptation to an electron source, a rotating electron deflection system, and a converging collimation system (FIG. 1).

In summary, the main advantages and differences of the device presented here are:
1. Generates higher dose concentration.
2. Use of permanent high-intensity magnets (0.3 T to 1.2 T).
3. Higher energy range (1 to 6 MeV).
4. Optimized effectiveness and efficiency.
5. Material, Lead or Wolfram.
6. Robustness and simplicity.
7. Low manufacturing cost.
8. Electron-only output, requiring less shielding.
9. Dual action with converging electron or X-ray photon beam output.
10. Dose painting action by varying focus on all three axes.

An advantage of the electron deflector system of the present device is that deflection can be done by using permanent high-intensity magnets, usually the deflectors are designed with electromagnets. The magnets of the present device allow deflection of the electron beam at a large angle close to 60° to 90° or more, over a short distance, which is defined as less than 3 centimeters, allowing a large reduction in the dimensions of the device in the original beam direction. This fact is essential for the adaptation of the device in the head output of a clinical use LINAC and allows the incorporation of a patient despite the limited space from the head output to the isocenter, 42 cm in one of the commercial devices and 48 cm for the other competitor.

Another advantage of this embodiment is that it is not necessary to operate the LINAC with an energy greater than 4 MeV because the maximum dose is more dependent on geometry than energy, therefore the LINAC device to be used can work at its lowest energy (4 or 6 MeV) during treatment, which prevents the generation of neutrons appearing at energies above 10 MeV, thus avoiding the peripheral dose generated by neutrons in healthy organs and a bunker with lower shielding requirements, as well as a lighter device.

Also, it is possible to apply this device to an even lower energy, of the order of 3 MeV, is energy that is not used in the current accelerators that come configured to energies of 6, 9, 12, 15, 18 and 21 MeV, that is multiples of 3 and therefore potentially these accelerators could be configured to 3 MeV, which makes this innovation a lighter and safer version.

In summary, this invention is a device that possesses in addition to a series of other accessories that make it up, and themselves constitute inventions within the main invention, and the absence of external power make the main version of what is proposed here represents a complete, compact and autonomous novelty characterized by a dual output of electrons and X-ray photons. Although an option can also be conceived with electromagnets with conventional power supply and cable communication.

BRIEF DESCRIPTION OF THE DRAWINGS

Before describing each of the drawings, the numerical list of each of the elements described in the figures is included.

DETAILED DESCRIPTION OF INVENTION

Converging irradiation scheme of rotating beams with varying rotation radius (B).

Figure 1:
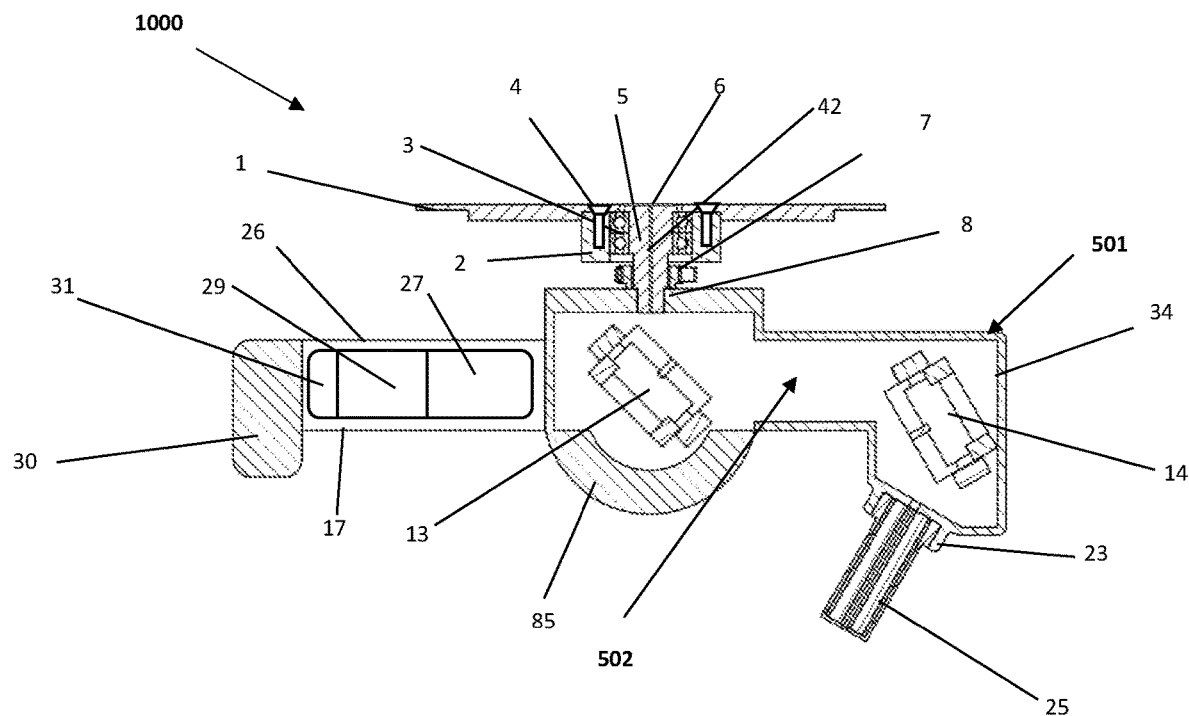
FIG. 1. Summarized view of the invention.
Figure 2:
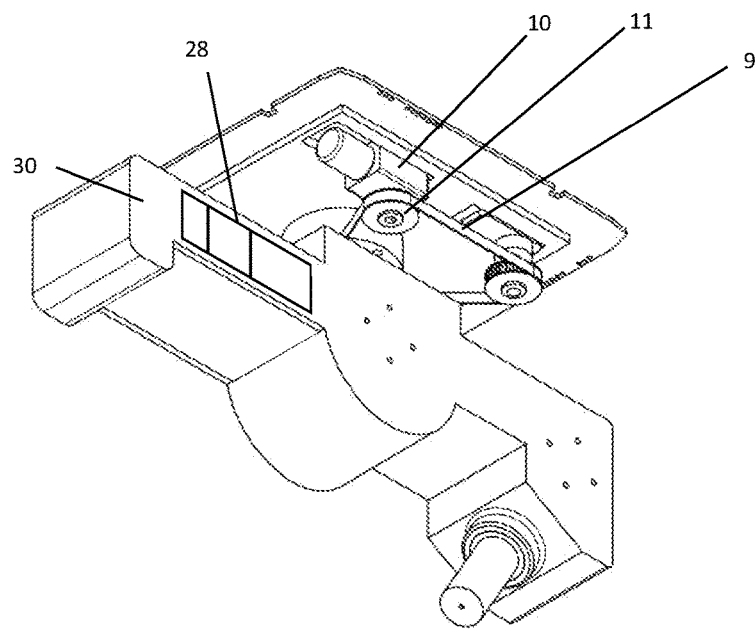
FIG. 2. General scheme of the invention viewed in perspective.

As shown in FIGS. 1 and 2, the device is formed of the following main parts:
A. Electron coupling and input means.
B. Rotation device.
C. Electron deflection system.
D. White disc and mobile filter (19).
E. For electron passage and/or X-ray photon generation.
F. Dissipation and shielding collimation system.
G. Focus control and sweep system.
H. Dosimetric system and laser guides.
I. Device control system.

The invention consists in the following: a coupling means (A) by which the electrons of the accelerator enter, this coupling means is basically a tray (1) that adjusts in shape and means to which each brand or models of accelerator currently use, it also has cavities and a central hole with window (6). It is followed by a rotation device (B) whose central axis (5) is hollow and is fixed to the coupling means by fixing means (4) such as bolts, so that the electrons can enter, the motor (8) and the pulleys (9) are fixed in the cavities of the coupling means. Further down is the deflection system (C) which consists in a rotating structure (17), thanks to the previous rotation device; this system that deflects and aligns the electron beam is formed by two magnetic deflectors with high intensity permanents close to 1 T, the first (13) opens the electron beam and the second closes it (14). The electrons emerging from the second focal direction deflector, as shown in FIG. 1 and FIG. 2. Depending on the choice, the electrons may or may not impact a mobile thin metal disk (19a) of high atomic number, greater than 50, inserted into a metal cylindrical heat sink and electron filter (19b) for thermal dissipation (D); the impact of the electrons generates X-rays, mainly in the focal direction of the system. A collimation and shielding system (20) (E) allows electrons or X-rays generated in the white disk to be collimated in the direction of the focus and the remainder to be absorbed by the shielding. So that there will be a narrow net electrons or X-ray photon beam (beamlet) emerging from the collimator output (25) in rotation, with varying rotation radius and always pointing towards a focal point similar to that achieved with an converging X-ray photon beam, but in this case it is a single beamlet in a dynamic mode. The position of the focal point can be modified thanks to a focus control and sweep system (F), this is modified thanks to the movement of the second magnet in conjunction with the coordinated movement of the collimator; the emerging beam dosimetry of the collimator is measured by a set of ionization chambers and also has one or more laser light sources pointing to the focus (G). Finally, a software controls all parameters and operating modes of the apparatus (H). Detail of each of these parts is described below.

A. Electron Coupling and Input Means

Figure 3:
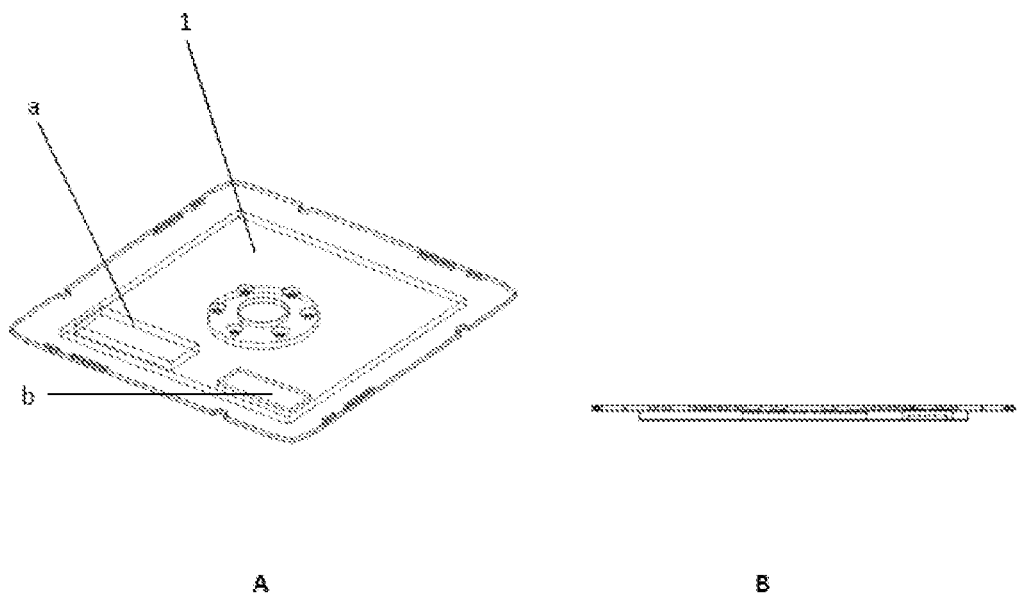
FIG. 3. LINAC coupling means in a commercial alternative.
Figure 4:
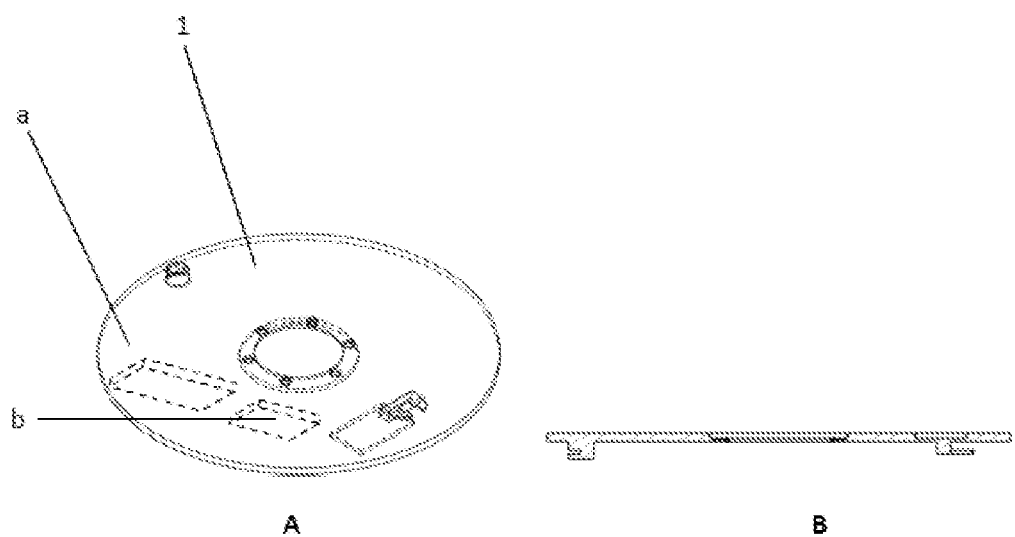
FIG. 4. LINAC coupling means, in another commercial alternative.

The electron coupling and input means is formed by a metal plate (1) of similar characteristics to the coupling means that each device already has according to its brand, as shown in FIG. 3 the coupling and input system adjusted to a type of commercial device and in FIG. 4 the one used by another brand and in general this coupling means is the same, so it can be adapted with minor modifications in size and shape according to the brand used. It also has cavities (a, b) and a central hole and holes with threads to be anchored to the rotation device by means of bolts.

B. Rotation Device

Figure 5:
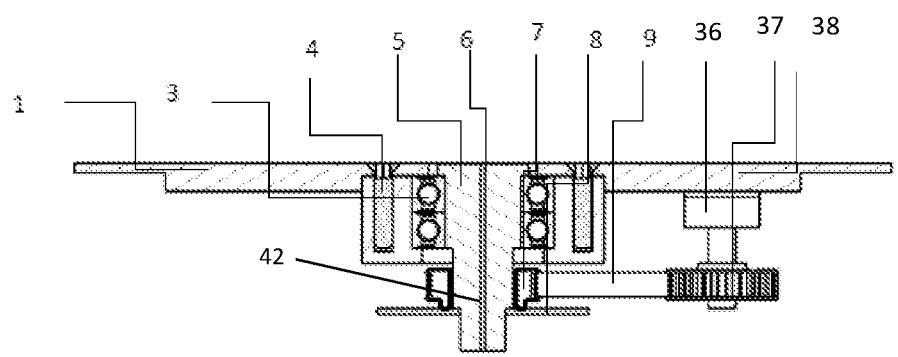
FIG. 5. Rotation device in general cutaway view.
Figure 6:
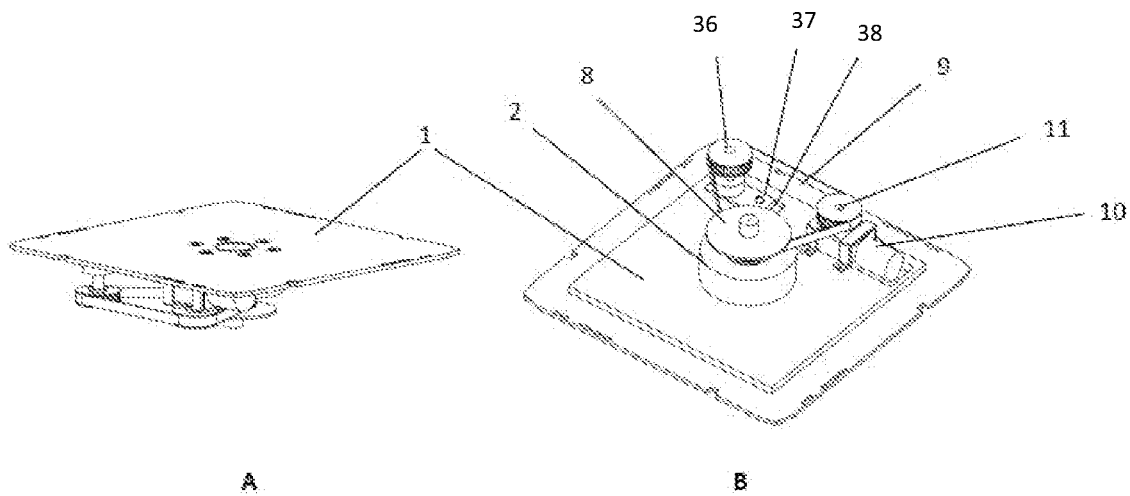
FIG. 6. Rotation device with two perspective views.

The main version of the rotation device is attached by clamping means (4), such as bolts, to the electron coupling and input means (A) consists in a set of pieces formed by: a central axis (5) is hollow that allows the rotation of the system, input window (6), and the electron passages, with bearings (3) to facilitate and fix rotation, with a support to the central axis (2) that allows the bearings to be contained, with a gear (7) that is part of the central axis, a coupling flange (8) that allows fixing to the deflection system (503), a gear belt (9) that connects to the geared motor (10) through a pulley with gears (11), which is tensioned by another pulley (40) with axle that can be slid by the rail (41) into a groove that is fixed by a screw (42). This whole assembly allows rotational movement of the electron beam, which is described below. FIG. 5 and FIG. 6.

Another preferred configuration of the rotation device described above is built entirely with gears which connect directly to the geared motor with the central gear, its simplicity is obvious and no drawing of this version is presented.

Another preferred configuration of the rotation device described above is based on the fact that it goes above the coupling device (A), however, this option implies that the output window of the LINAC must be removed, or this one replaced with another that can be retracted in the concentration mode this option. It involves a greater intervention, however, there is a better use of the available space, gaining about 8 cm of space between the output and the isocenter.

Another preferred configuration of the rotation device described above is based on an adaptation of the head rotation system of LINAC itself. Like the previous case, the rotation system is above the coupling device (A) and the deflection system is practically glued to the latter. However, the output window of the LINAC must be removed or this replaced with another that can be retracted in the concentration mode.

C. Electron Deflection System

Figure 7:
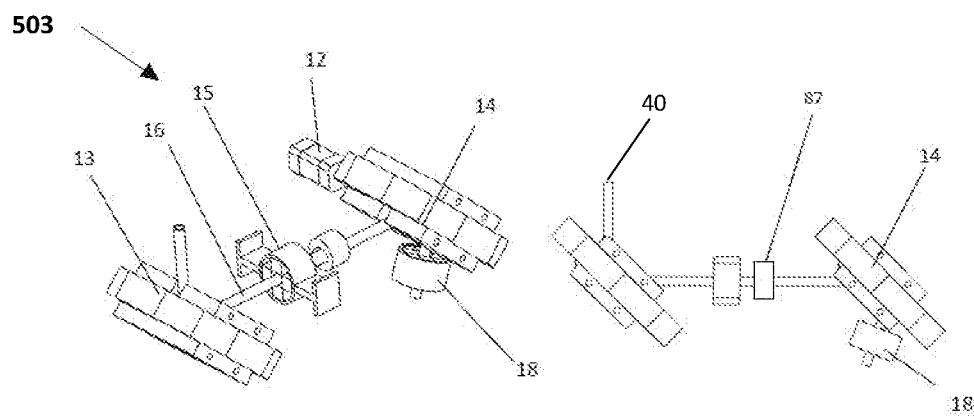
FIG. 7. Main deflection system, and electron guide, with perspective views A and side view B.
Figure 8:
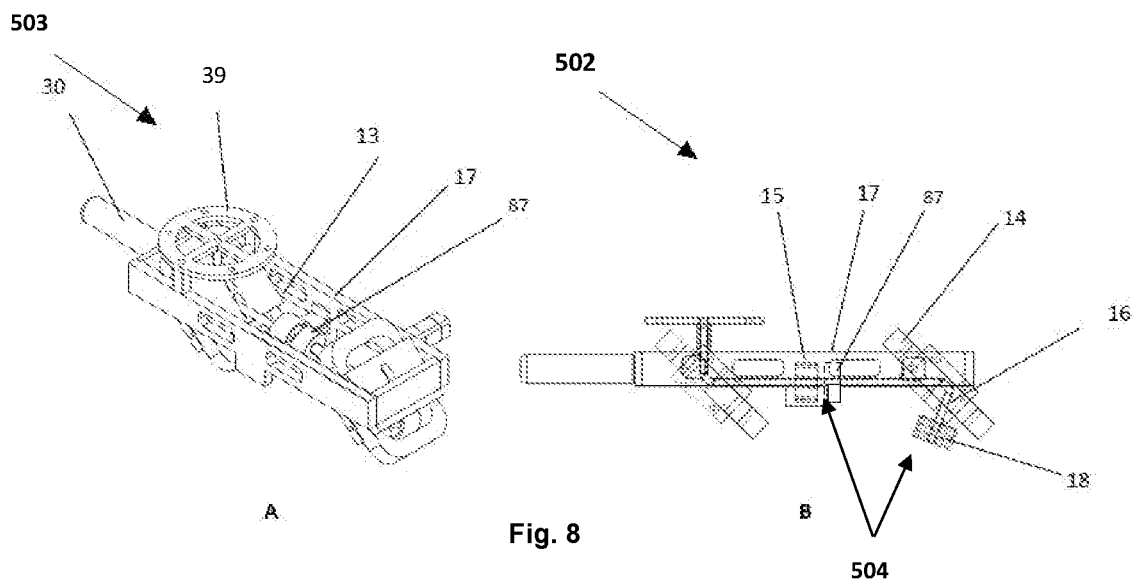
FIG. 8. Structure of the main deflection system, and electron guide, with perspective views A and side views B.

The main version consists in two permanent deflector magnets and two permanent magnetic quadrupole and/or focusing dipoles, the first of which is a fixed deflector magnet that opens the beam (13) and goes in an oblique position to the direction of the incident electron beam at the output thereof there is a quadrupole magnetic device (15) that aligns the output beam, also built with permanent magnets. A second magnet (14) similar to the first deflects the beam in the opposite direction, bending it towards the axis, the incidence of the electrons in this second magnet is oblique and it occupies the shortest possible distance in the incidence direction. The electrons are driven through a tube of non-magnetic S-shaped material (16) into vacuum passing through the different devices, entering through the first deflector magnet up to outputting through the quadrupole (18) to the output of the second deflector magnet. See FIG. 7. The structure on which the deflection system is mounted has a clamping ring with holes (43) that is attached to the coupling flange (8) of the rotation system is shown in FIG. 8.

Figure 34:
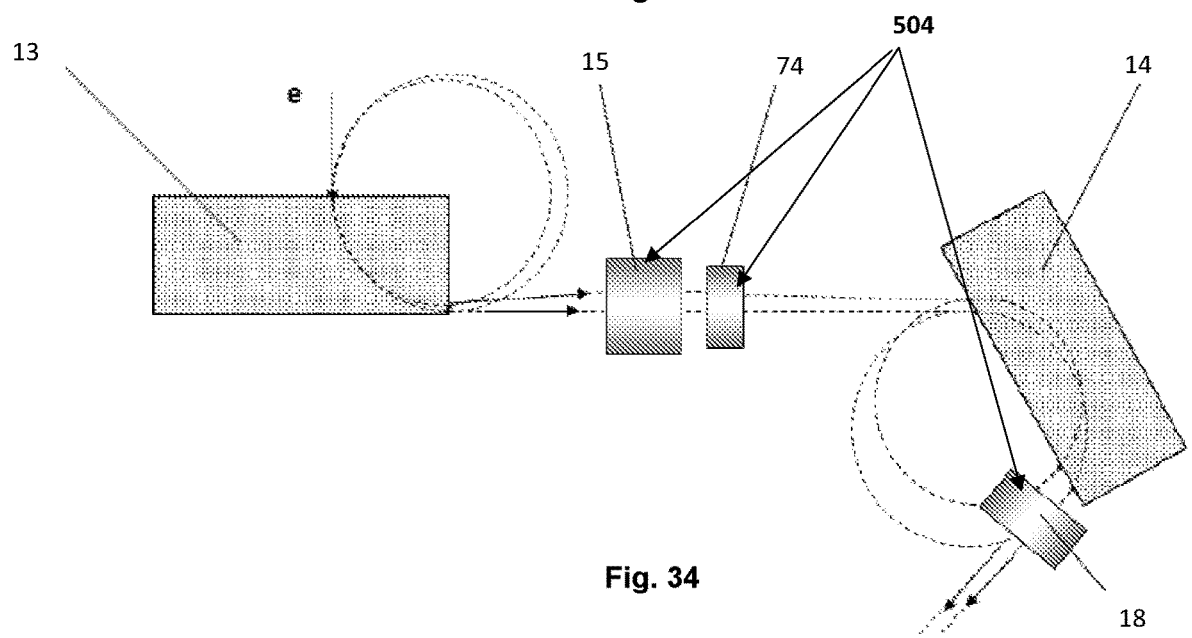
FIG. 34. Scheme of the basic deflection system with correction elements.
Figure 35:
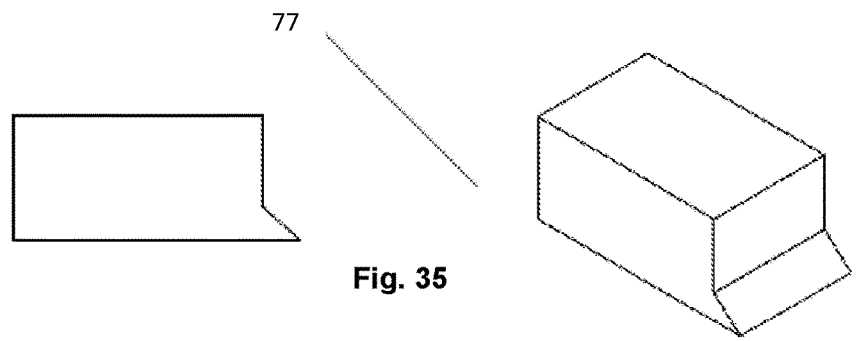
FIG. 35. Cut-faced magnet, as correction elements.
Figure 36:
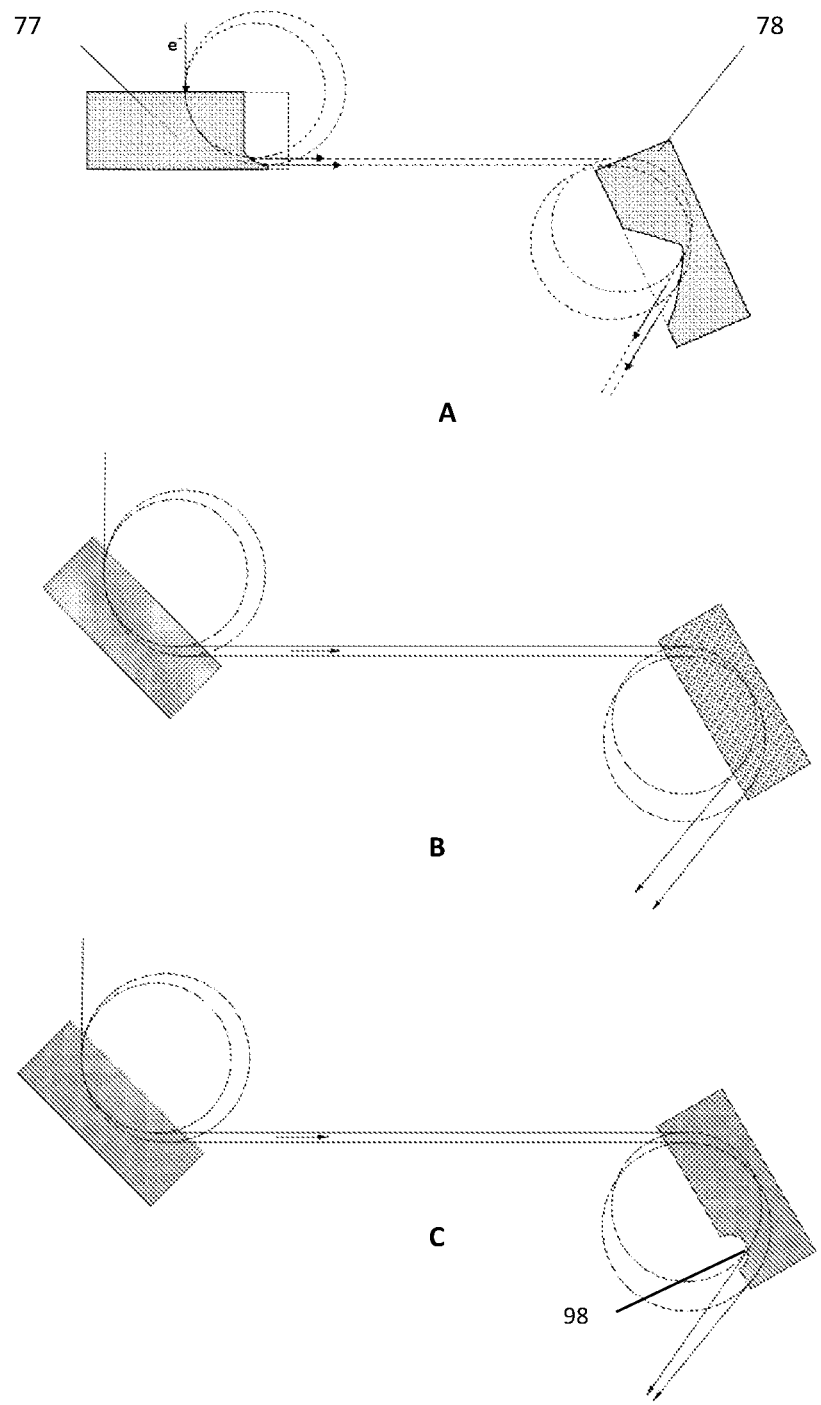
FIG. 36. Deflection diagram with magnets if deflection elements, with cuts (A), both inclined with entry and exit on the same faces (B) and equal to previous with cut for focus (C).

When a filiform beam of quasi-monochromatic electrons passes through a magnetic deflection element, it undergoes an expansion of the filiform beam, due to the different radii of curvature experienced by the electrons generated by their energy differences between the electrons of the beam, since this is not 100% monochromatic. A schematic of a deflection base configuration with the two deflectors with the permanent magnets and the beam correction elements is shown in FIG. 34. This beam correction can also be performed by cutting on one or more faces of the base magnets, as shown in FIG. 35 and FIG. 36A. A schematic configuration without the electron beam correction elements with and without cutting magnets is shown in FIGS. 36 B and 36 C.

Figure 9:
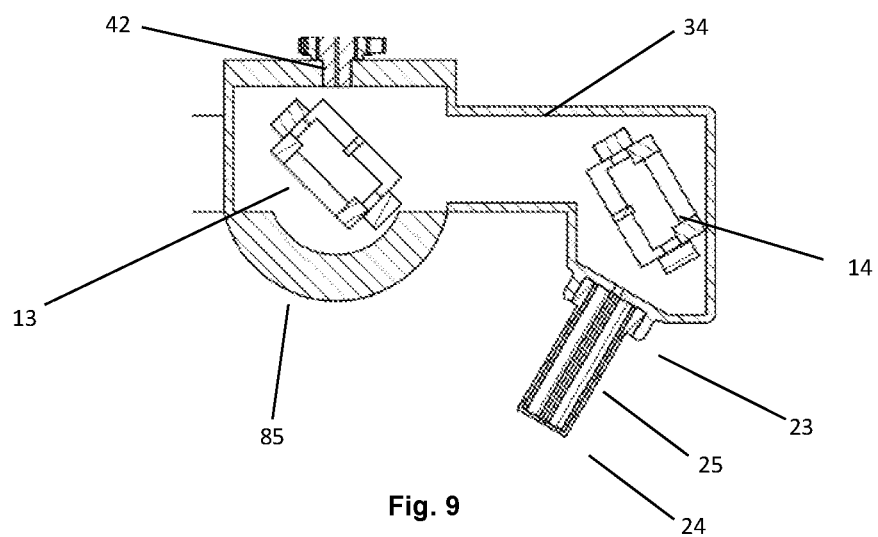
FIG. 9. Deflection system with the second magnetic deflector embedded within the head.

Another preferred configuration of the deflection system described above is with sealed outer housing (34) with the two magnets inclined, with the first magnet at 45° inclination for 90° output of this magnet, in a sealed environment as shown in FIG. 9.

Figure 10:
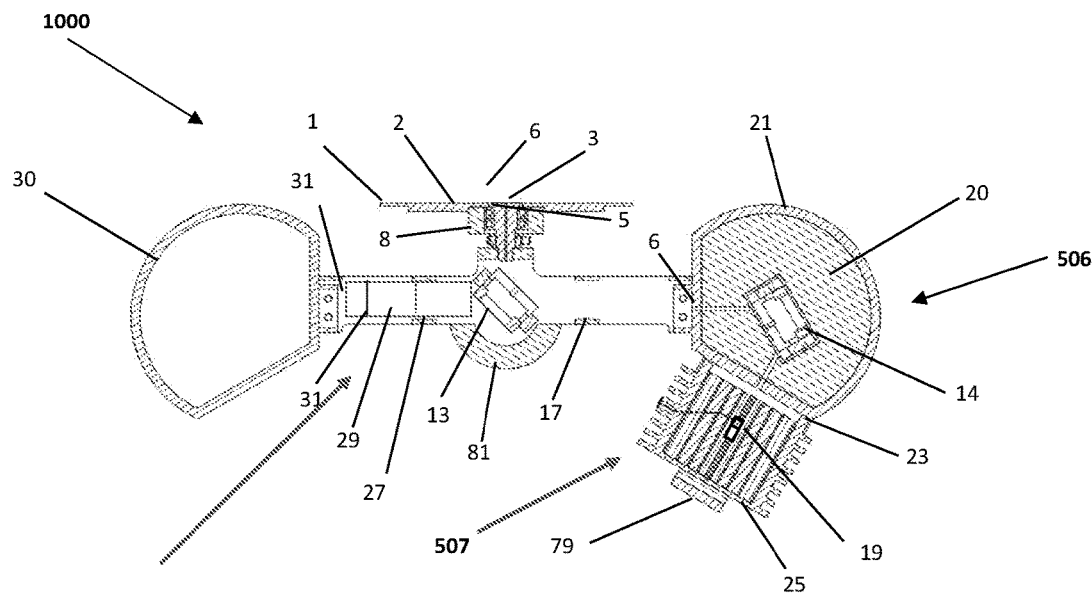
FIG. 10. Deflection system without guide tube with sealed unit.

Another preferred configuration of the deflection system described above is with the outer housing with the two magnets inclined and shielding head adhered to this deflection system with the second magnetic deflector embedded within the head FIG. 10

Another preferred configuration of the deflection system described above, has a fixed S-shaped guide tube FIG. 11A.

Another preferred configuration of the deflection system described above, has an extendable S-shaped guide tube FIG. 11 B.

Figure 11:
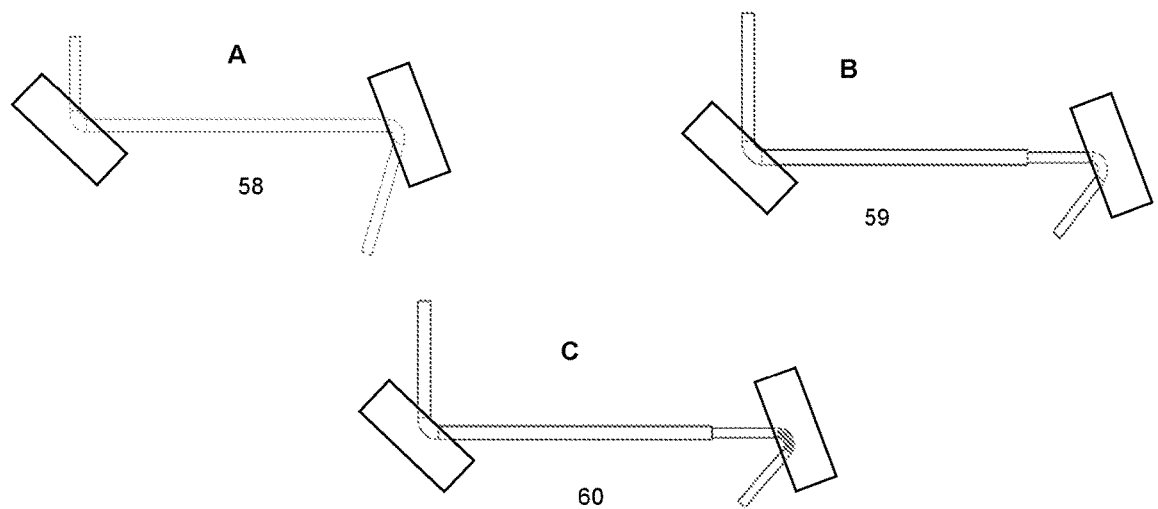
FIG. 11. Deflection system with guide, fixed (58) A, telescopic (59) B, telescopic tubes and flexible and telescopic tube S (60) C.

Another preferred configuration of the deflection system described above, has an extendable and flexible S-shaped guide tube FIG. 11 C.

D. Mobile Disc and Filter for Electron Passage and/or X-Ray Photon Generation

Figure 12:
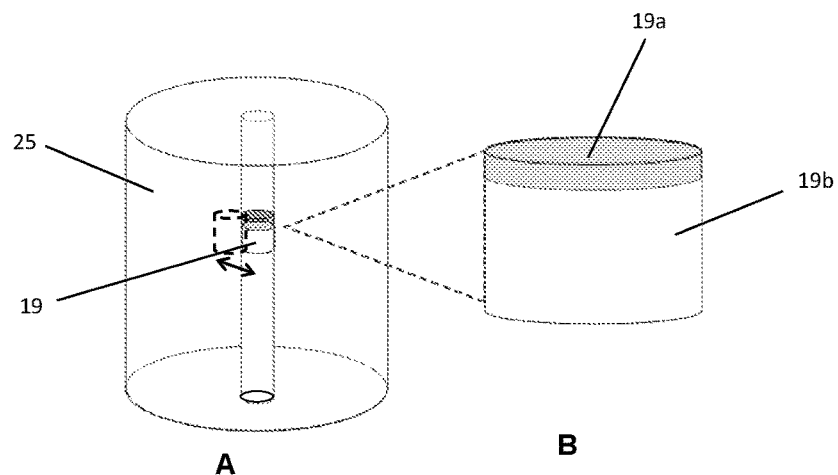
FIG. 12. A thin cylindrical white disk with electron filter (19) inserted into the collimator tube (25) in perspective views (A), wherein the double arrow shows the displacement of the thin cylindrical white disk with electron filter, to leave the device in electron mode, when the thin cylindrical white disk with electron filter (19) is in the side compartment (90) or to leave the device in photon mode X, when the thin cylindrical white disk with electron filter (19) is in the septa of the collimator or when the electron beam impacts the thin cylindrical white disk with electron filter (19) and detail (B) of the thin cylindrical white disk with electron filter (19).
Figure 13:
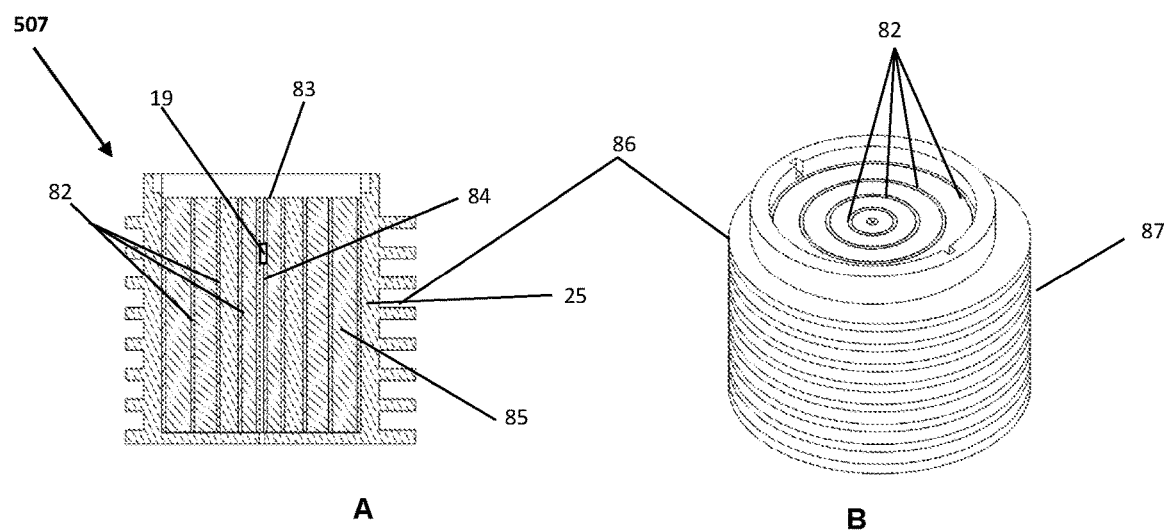
FIG. 13. Collimator with heat sink with built-in filter white (19) with concentric conductive cylinders (82), septa tube (83), septa (84), attenuation material (85) plus heat sink rings (86), preferably manufactured of materials with thermal conductivity such as aluminum, copper, boron, among others, in perspective views (A) and in axial section (B).

This system consists in a thin disc (26) of a thermal conductive material, light thermal conductive materials Cu or Al, FIGS. 12A and B which goes inside the collimation tube FIG. 13A, which is manufactured of several concentric cylinders of different conductive metals (84) and photon attenuators X (87), with a system of circular thermal conductive vanes (82) adhered to the outside of the collimator FIG. 13 B and in turn it is attached by means of a coupling

(83) to the structure of the shielded head of the rotating deflection system at the output of the electron beam of the second collimator FIG. 10. This disc is the white filter (19) where, the electrons impact and there X-rays are generated by the predominantly Bremsstrahlung effect. An appropriate combination of the thickness of the target material, its high atomic number and the energy of the electrons will allow the generation of X-ray photons mainly in the direction of incidence and the removal of the disk will allow output of electrons FIG. 12A shows the inner part of the collimates and a zoom (B) showing a detail of how the whole of the invention is going in the part where the X-rays are generated, the electrons are filtered, shielded and collimated.

E. Dissipation and Shielding Collimation System

The impact of the electrons on the target generates heat, although they must travel a greater distance and pass through the deflectors that expand the beam and degrade it energetically in most X-ray equipment including LINAC, the heat generated in a small area of the order of ten square millimeters in the impact zone, which it is necessary to extract from there by means of a water cooling system. In this case because the target is a ring inserted into a thin disc of a conductive material, of high atomic number greater than 50 (W) all this thermal energy is conducted and distributed in a much larger area through the heat exchanger rings, water cooling is not necessary and therefore the heat can be extracted by circulating air, due to the movement of the device thanks to the rotating system.

This collimation and shielding system (F) is formed by a cylindrical collimator (25) similar to that used in stereotactic radiosurgery adjusted to lower operating energy of the LINAC (6 MeV), since for higher energy it is required a greater size. That is, the dose concentration mode is recommended for the lower operating energies of the LINAC. In this way less powerful magnets are required to perform beam deflection and less shielding, all this translates into cost and space. The collimator has an internal channel or septa (85) (54) FIG. 13.

Figure 14:
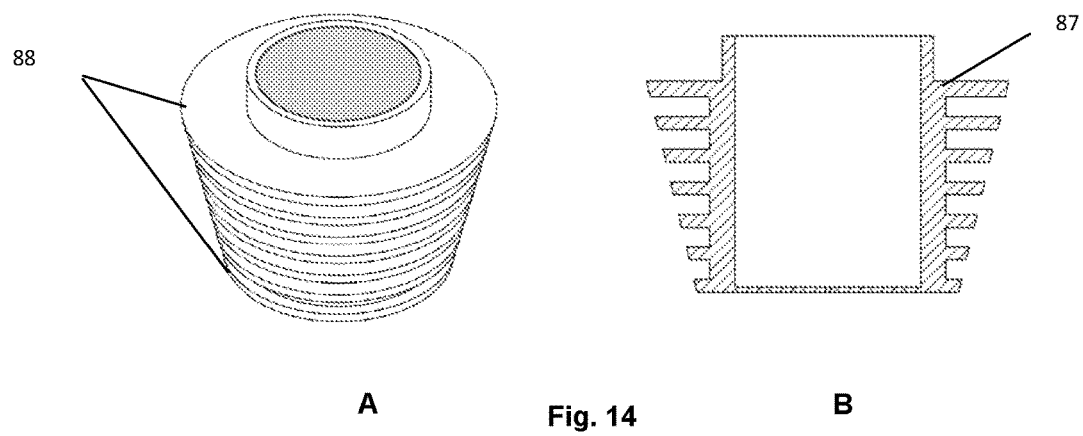
FIG. 14. Conical heat sink (87), in perspective views (A) and axial cut (B).

Another preferred option of the collimation system is by means of a collimator cooling system with conical vanes (88). FIG. 14.

Figure 15:
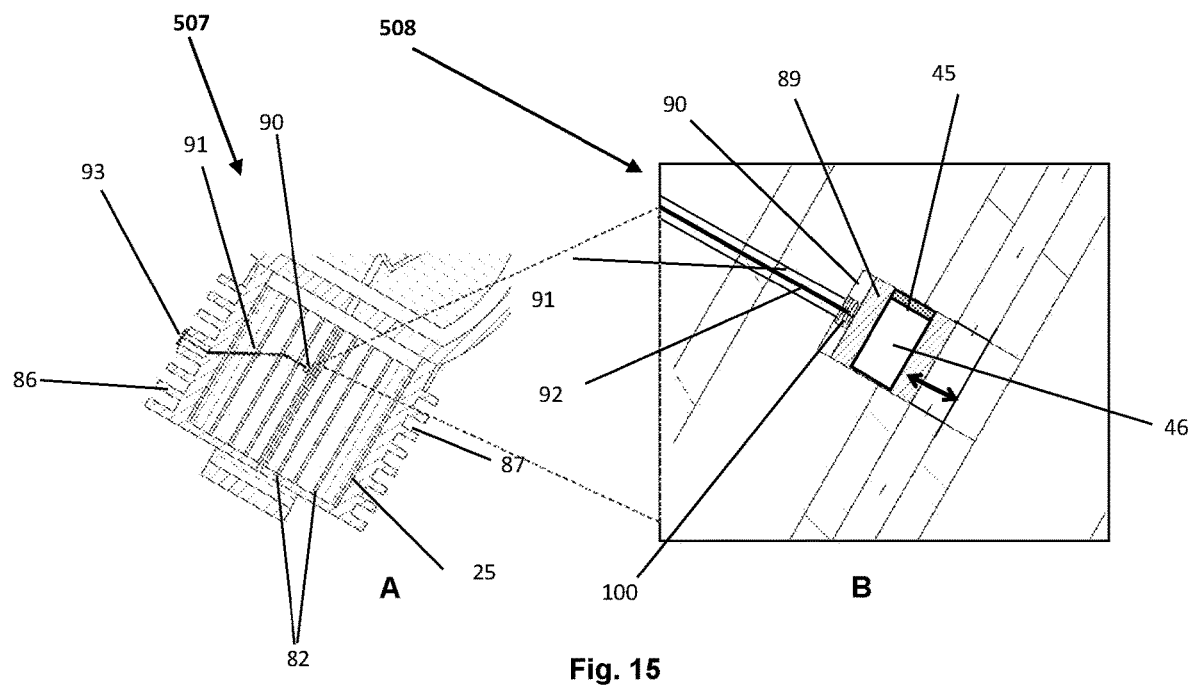
FIG. 15. Detail of moving target area with cut views of FIG. 1 (A) and zoom (B).

Another preferred option features a mobile electron white filter 19 allowing selection of the output of the radiation type, electrons without the filter in the septa channel (85), or X-ray photons with the white filter. The shift mechanism consists in a piece containing the filter blank (94) within a small cavity (95) of about 1 cm³ by the side of the septa, the piece of the filter blank is attached to a spring 96 at the proximal end which in turn the spring is attached to a string (97) at its other distal, which can be moved along a curved hole (98), and is fixed at its end by a lock (99). FIG. 15.

Another preferred configuration of the white filter disk is that it is located inside the septa FIG. 16A.

Figure 16:
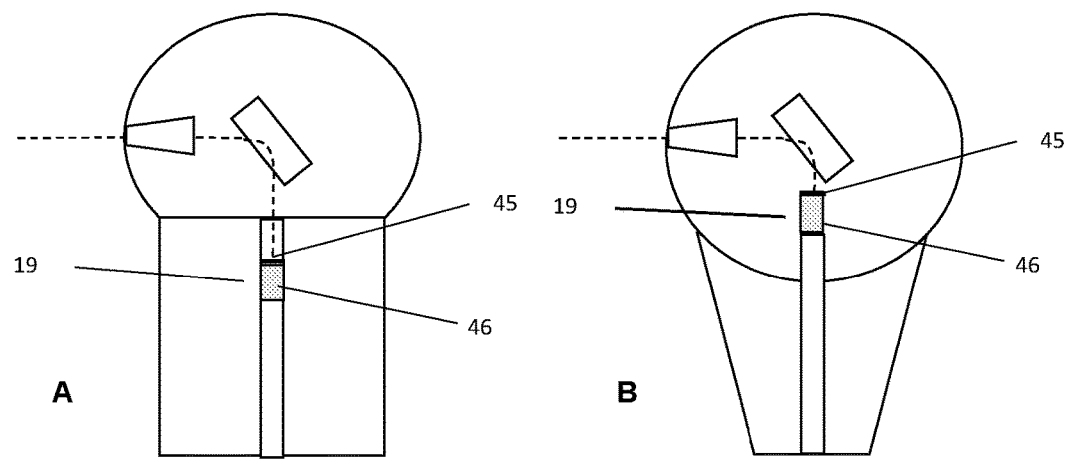
FIG. 16. Detail of a fixed target in collimator tunnel A and at the exit of head B with conical collimator.
Figure 17:
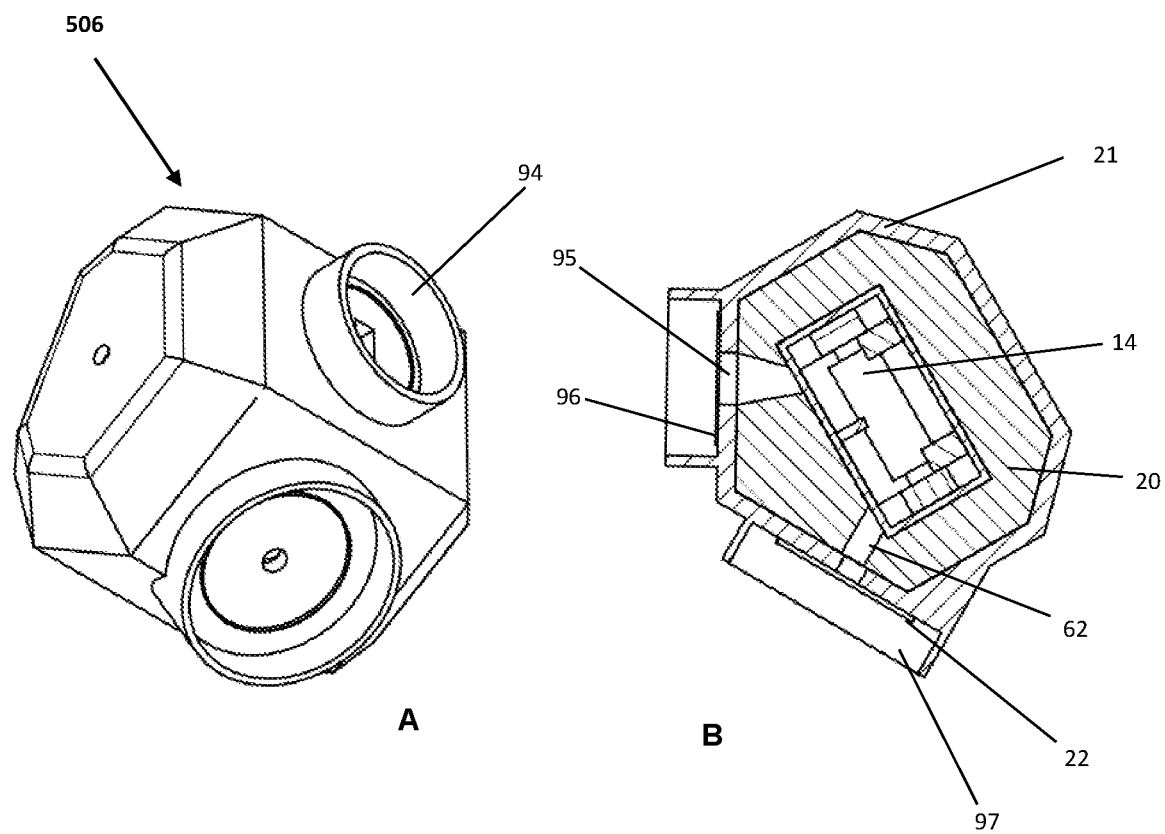
FIG. 17. Head shielding with perspective views (A) and axial cut (B).

Another preferred configuration of white filter disk is that it is located in the shielding head output of the second magnetic deflector and uses conical shielding collimator FIG. 16 B Another preferred configuration for electron and photon X output requires shielding (20) as shown in FIG. 17, which has a conical rectangular input channel (89), an input coupling means (90), an input coupling seal (91), an outer housing (92), an output tube (92), an output channel (93) and a coupling means for the collimator (94).

F. Sweep and Irradiation Focus Control System

This system allows to vary the position of the concentration point of the X-radiation or focus, although by default this focus is located in the isocenter of the LINAC. The movement of the focus around the isocenter allows for a dose scan within the tumor, better known as a "dose painting" technique that is not used in this type of accelerator, but thanks to this invention it is possible to carry out.

Focus Control

A preferred configuration without focus control, for electrons in this option the parts are fixed without displacements or rotations, is the simplest version of the invention, as shown in FIG. 17. Control or sweep by the focus is performed by movements of the object to be irradiated, for example, moving a stretcher with the patient to be treated.

Figure 18:
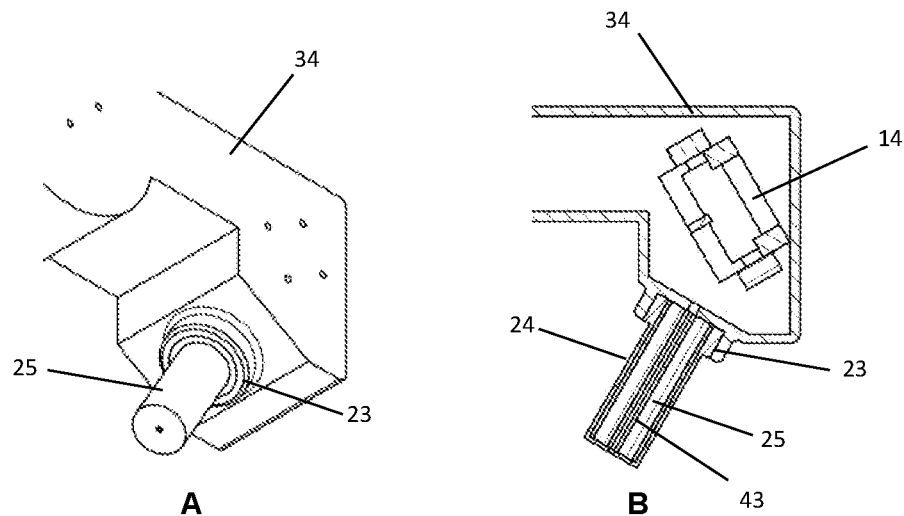
FIG. 18. Device with electron version focus control with fixed focus, with perspective views (A) and side views (B).

In another preferred configuration without focus control, for electrons or X-ray photons, in this option the parts are fixed without displacements or rotations, it is the simplest version of the invention, as shown in FIG. 18. Control or sweep by the focus is performed by movements of the object to be irradiated, for example, moving a stretcher with the patient to be treated.

Figure 19:
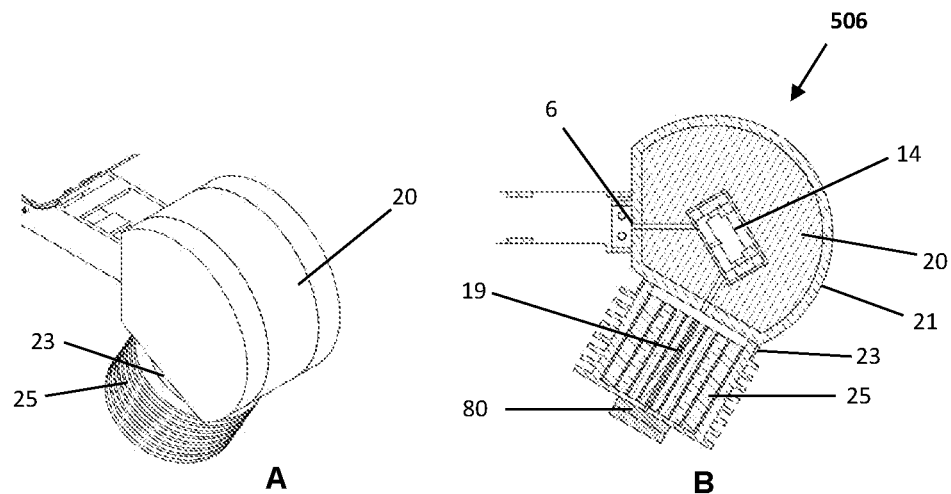
FIG. 19. Device with electron or X-ray photon version focus control with fixed focus, with perspective views (A) and side (B).

Another preferred configuration is of focus control with electron convergence fixed angle, in this configuration it is possible to achieve displacement of the focus by linearly displacing (moving away or approaching) the magnet 2 (14) with respect to the axis of rotation, the displacement is carried out by driving a motor (11), wherein the displacement is along the electron trajectory line that is set after passing the magnet 1 (13). This movement is made with deflector 2 (14) in solidarity with collimator 25, as shown in FIG. 19.

Figure 20:
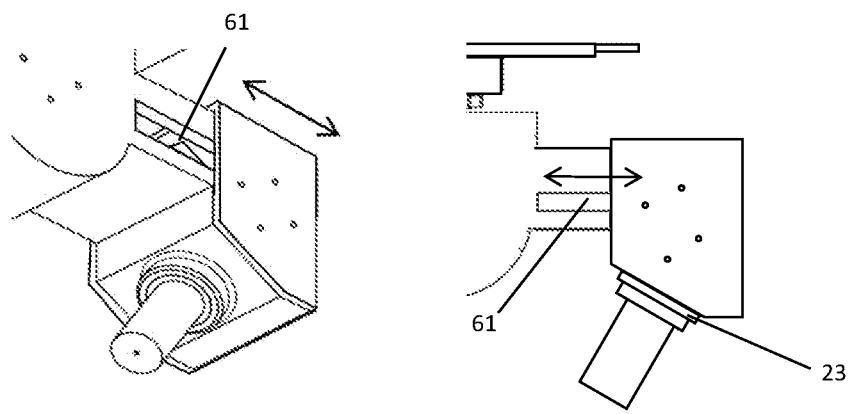
FIG. 20. Device with focus control electron version, with focus modification through radial displacement for radius modification, with perspective views (A) and side views (B).

Another preferred configuration is of focus control with electron convergence angle X, which corresponds to a dual configuration, in this configuration it is possible to achieve displacement of the focus by linearly displacing (moving away or approaching) the magnet 2 (14) with respect to the axis of rotation, the displacement is carried out by driving a motor (12), wherein the displacement is along the line of the trajectory of the electrons that is established after passing the magnet 1 (13). This movement is made with deflector 2 (14) in solidarity with collimator (25), as shown in FIG. 20.

Another preferred configuration is focus modification with fixed incidence angle, it is the same to the above plus beam correction elements, quadrupoles and dipoles, not shown in the figures.

Figure 21:
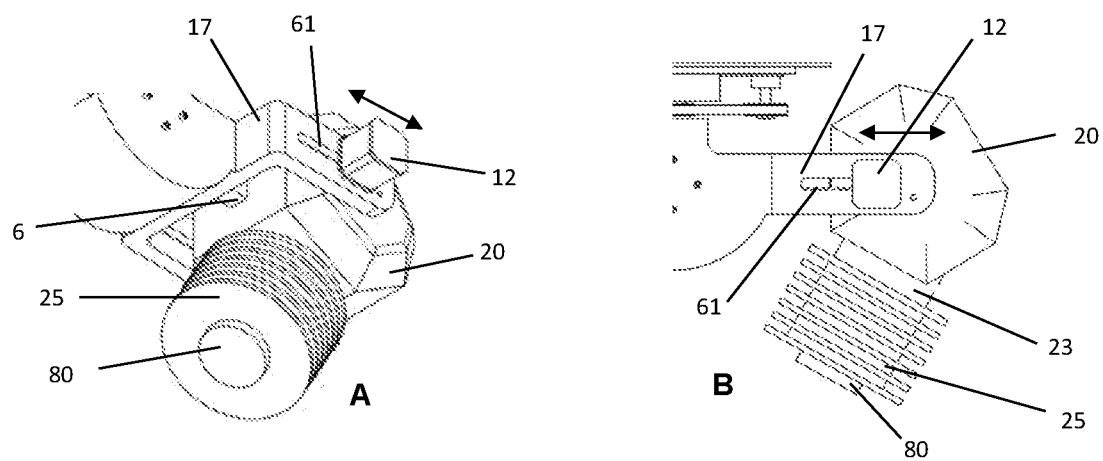
FIG. 21. Device with electron version or X-ray photon focus control, with focus modification through radial displacement for radius modification, with perspective views (A) and side views (B).

Another preferred configuration is focus modification with displacement and varying angle: with electron output, in this configuration it is possible to achieve displacement of the focus by angularly displacing the magnet 2 (14) with respect to the axis of rotation, the displacement is carried out by driving three stepper motors, wherein the magnet 2 (14) is displaced by driving the first angular motor (22), the angular displacement of the collimator (25) by means of the second angular motor (22a) and with a linear movement, through the linear motor (22L), as shown in FIG. 21.

Another preferred configuration is focus modification with displacement and varying angle and linear displacement of the focus, wherein this configuration is possible to achieve displacement of the focus by linearly displacing (moving away or approaching) the magnet 2 (14) with respect to the axis of rotation, the displacement is carried out by driving a motor (12), wherein the displacement is along the line of the trajectory of the electrons that is established after passing the magnet 1 (13), together with the displacement of the focus by angularly displacing the magnet 2 (14) with respect to the axis of rotation, the displacement is carried out by driving three stepper motors, wherein the magnet 2 (14) is displaced by the drive of the first angular motor (22), the angular displacement of the collimator (25)

by means of the second angular motor (22*a*) and with a linear movement, through the linear motor (12), as shown in FIG. 21.

This movement is made with deflector 2 (14) in solidarity with collimator (25), as shown in FIG. 20.

Figure 22:
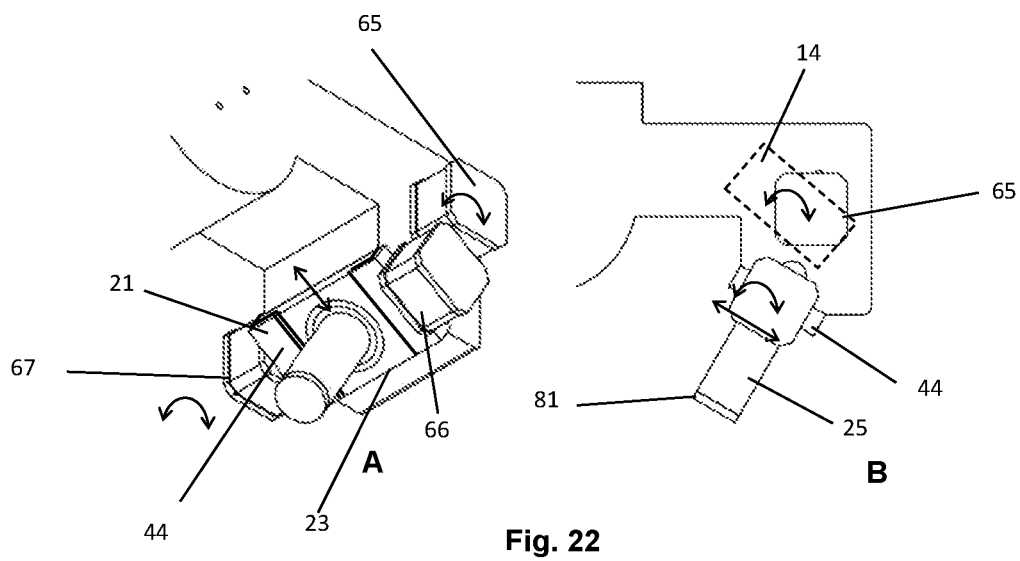
FIG. 22. Device with electron version focus control, with focus modification through convergence angle variation, with perspective views (A) and side views (B).
Figure 23:
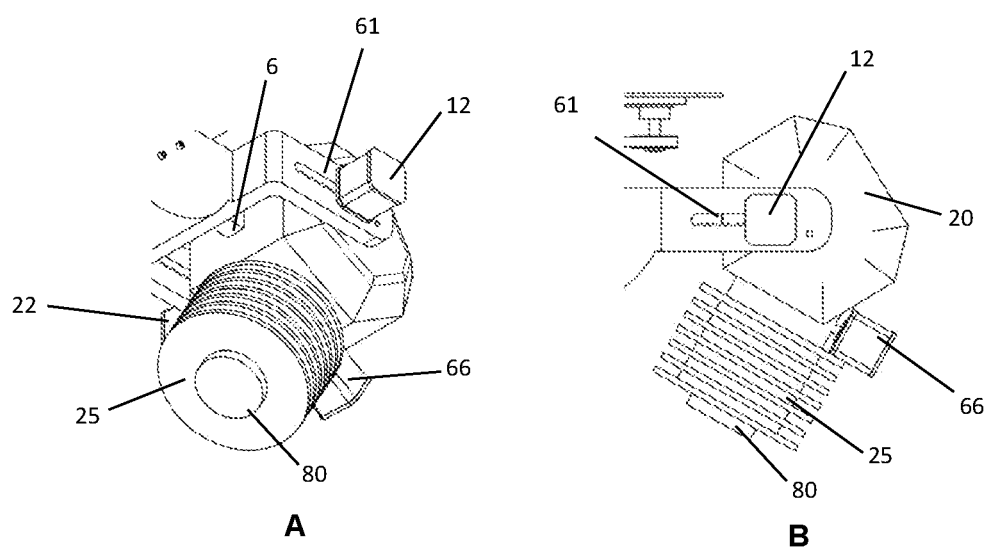
FIG. 23. Device with electron or X-ray photon version focus control, with focus modification through convergence angle variation, with perspective views (A) and side views (B).

Another preferred configuration is focus modification with displacement and varying angle: with dual output, electrons or X-ray photons. This option adds to the above the ability to rotate magnet 2 with a motor (53) and collimator (25), in addition to the displacement. This option is the most complete and in turn most complex and uses at least four stepper motors, as shown in FIG. 22.

Another preferred configuration is focus modification with displacement and varying angle: it is the same to the above plus beam correction elements, quadrupoles and dipoles.

Sweep

Figure 37:
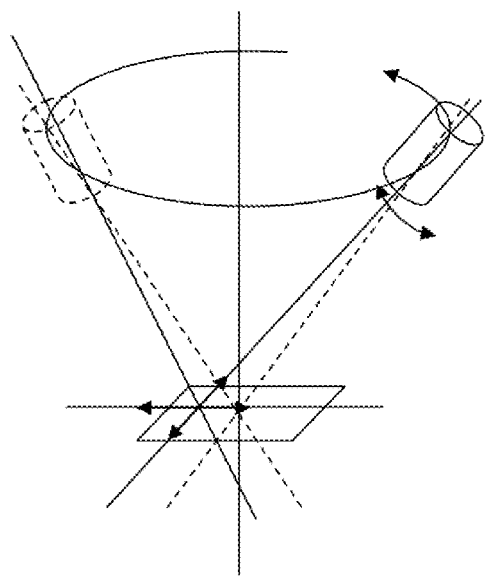
FIG. 37. Scheme of 2D scanning de focus for out-of-axis dose painting.

Another preferred configuration for achieving a 2D sweep of the focus is achieved by a combined movement between rotation and exit angle of the rotating beam in each rotation FIG. 37. Which is controlled by the scanning software that sets angle parameters of the magnetic deflector 2 plus collimator in electron version of the head of the magnetic deflector 2 plus collimator in dual version, that is, for each rotation and part of rotation or exposure time associated with a scanning point, in a discrete or continuous scanning mode, in other words rotating and sweep at the same time, with a out-of-axis scanning focus moving (painting) in the X,Y plane, as shown in FIG. 37.

Figure 33:
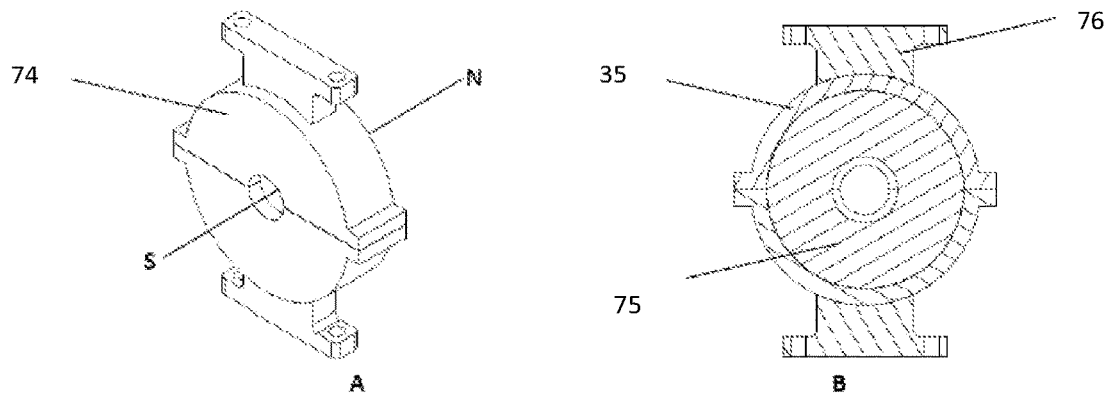
FIG. 33. Detail of a permanent magnet focusing circular magnetic dipole.

Another preferred configuration for performing a 3D scan of the area of interest contemplates the application of the rotating beam, either electron or X-ray photon, with out-of-axis focus as shown in FIG. 33. This embodiment is achieved through the controlled angular movement of the second baffle and collimator.

Another preferred configuration of focused irradiation is by rotation with varying radius, helical movements of the rotating beam in this way a major input area of the radiation is achieved and greater concentration in the focus FIG. 20.

G. Dosimetric System and Laser Guides

Figure 38:
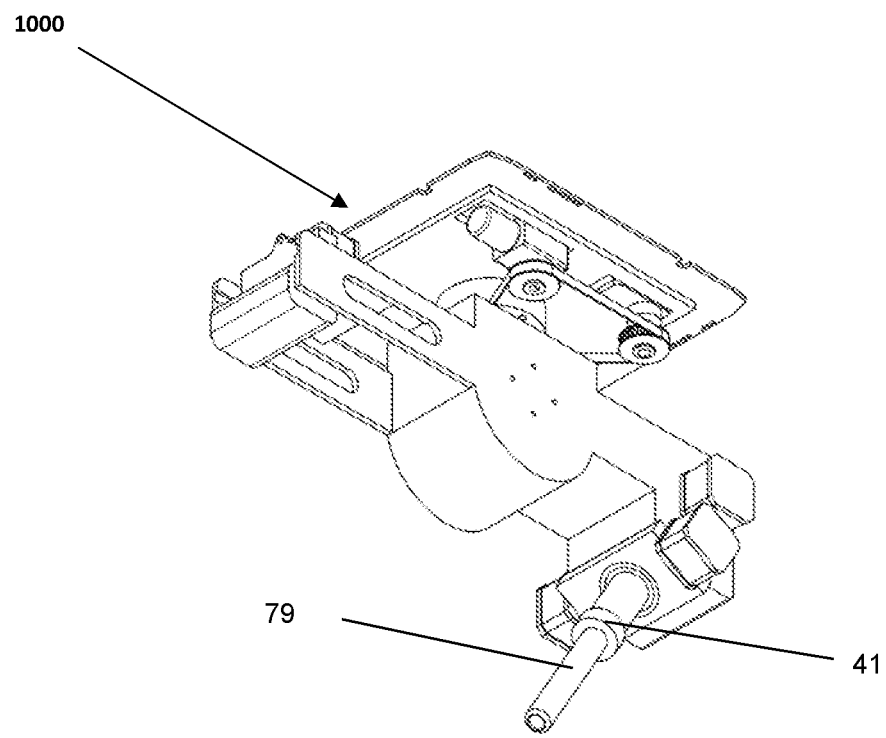
FIG. 38. Electron output device with extender element (79), which minimizes the dispersion of electrons in the air.
Figure 39:
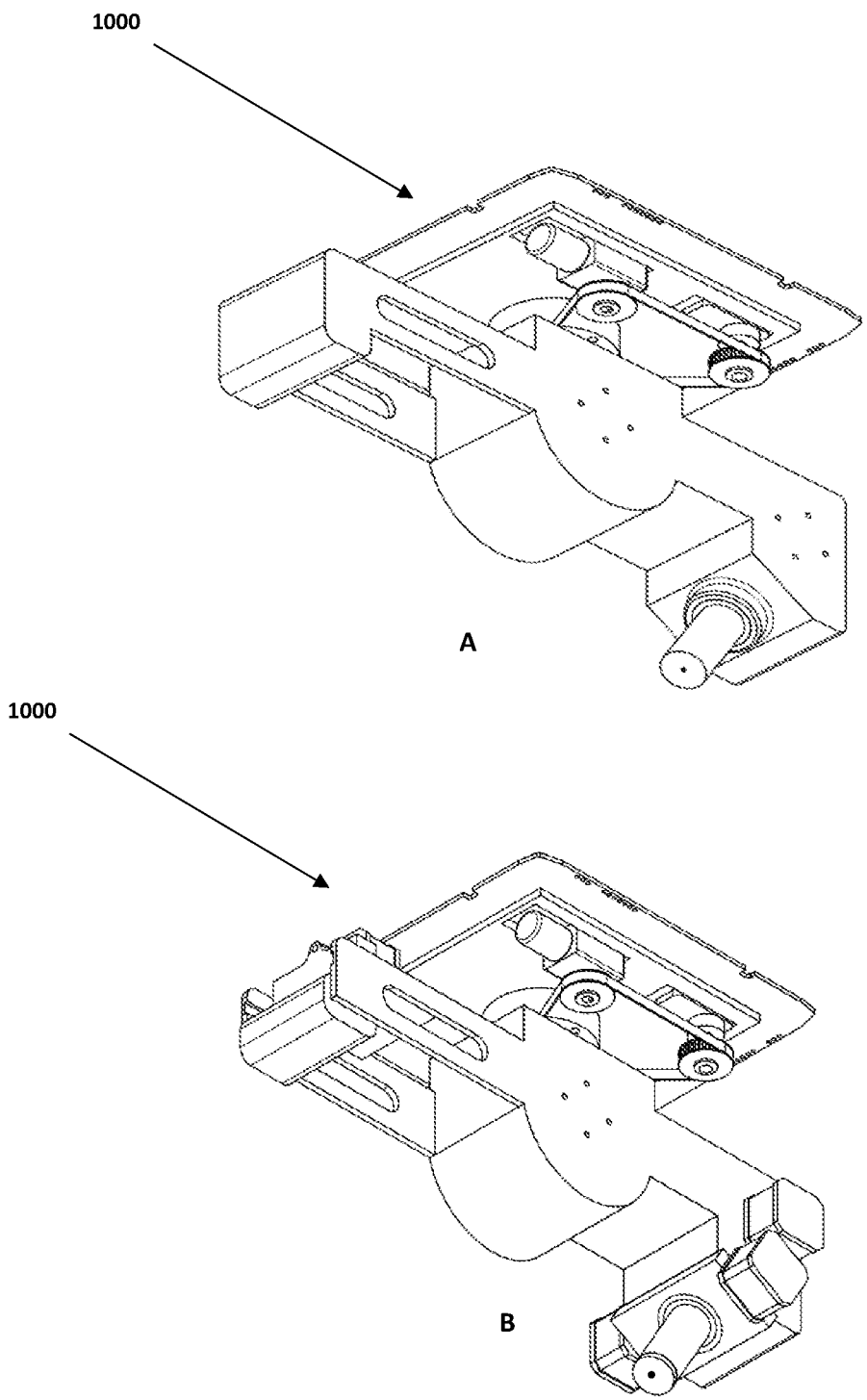
FIG. 39. Device, with fixed electron output; with fixed output (A) and with lateral displacement and varying angle (B)
Figure 40:
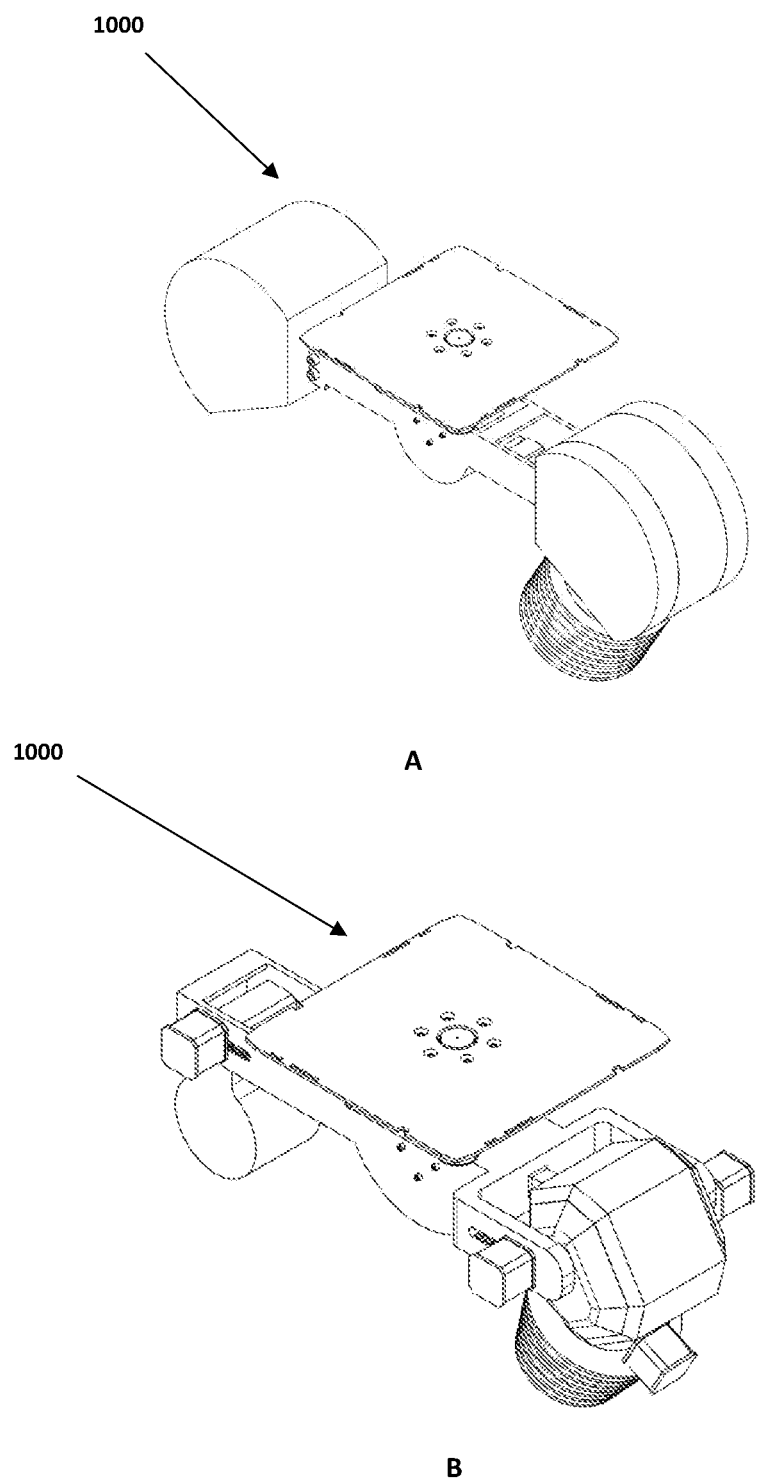
FIG. 40. Dual device (electrons or X-ray photons) with fixed output (A) and with lateral displacement and varying angle (B)
Figure 41:
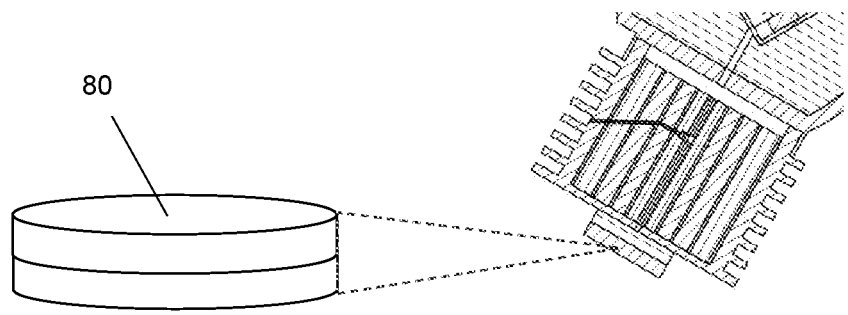
FIG. 41. Radiation monitoring ionization cameras.
Figure 42:
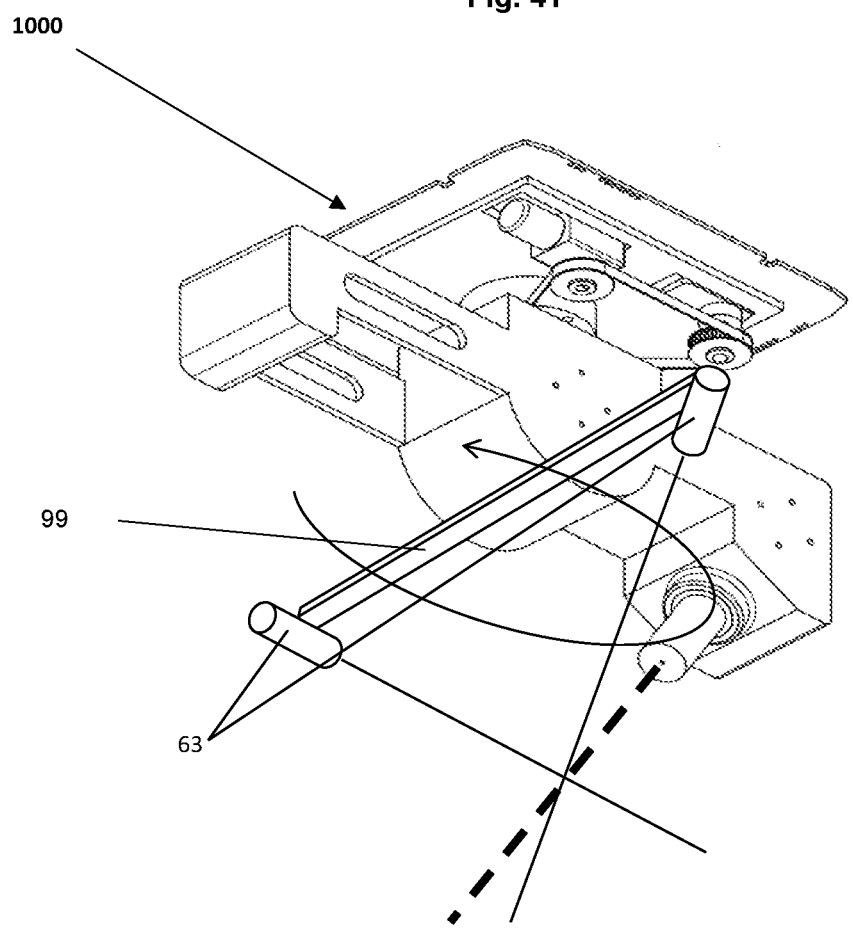
FIG. 42. Laser guides for calibration and visualization of the rotating beam.
Figure 43:
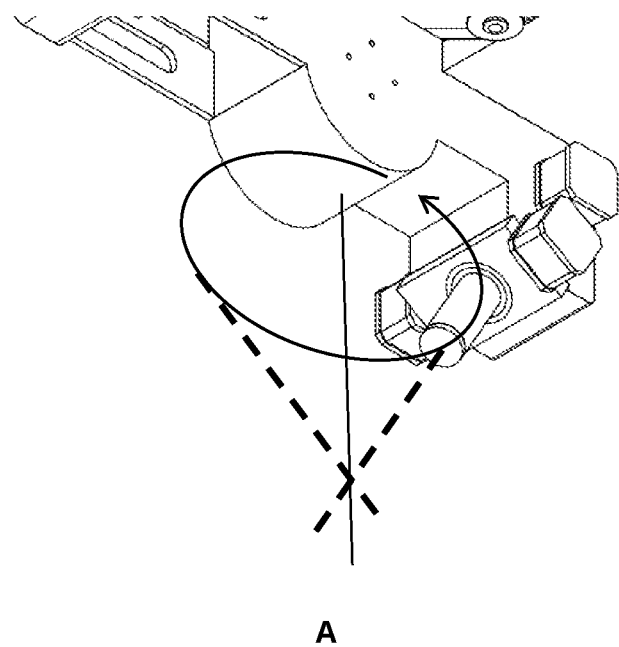
FIG. 43. Converging irradiation scheme of rotating beams with fixed radius (A).
Figure 43:
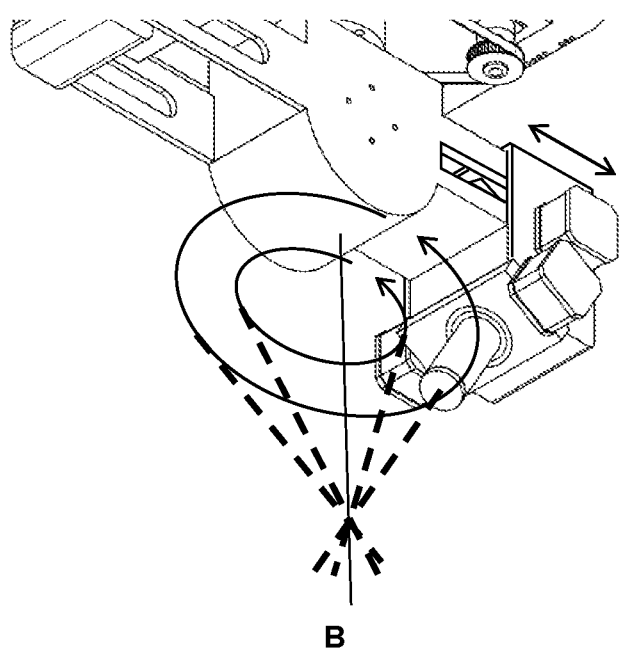

The dosimetric monitoring system consists in two gas ionization chambers with thin aluminized windows, these go to the output of the collimator, which as conventional equipment, allow to monitor the radiation intensity delivered by the device see FIG. 37 in addition to this there are two or more laser guides pointing towards the focus. (FIG. 38).

H. Device Control System

As previously mentioned, the system as a whole is controlled by software that establishes the operating conditions in conjunction with the operation of the LINAC coordinate the different modes of operation according to the treatment plan that is established. The angular speed of rotation is controllable by stepper motors, electron braking, focus position and rotation cone angle.

Another preferred configuration is wireless is via Bluetooth, the latter option is simpler from a mechanical point of view, since it introduces an electronic communication element without physical connectors compared to the previous option. In this option, it may be used batteries that can be housed in a compartment (31) located on the arm (30) of the rotation device supporting counterweight (34) FIG. 27.

Figure 26:
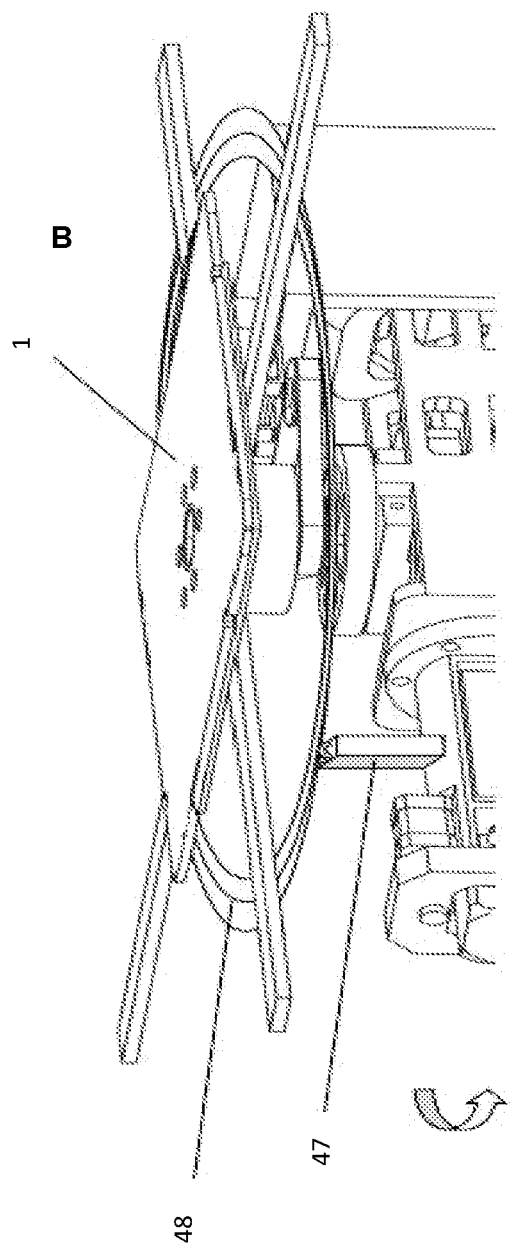
FIG. 26. Connection to external energy by ring and brushes.

In one version, the energy to power the motors found in the rotating unit may be directly delivered by an external source through a rotary connector 58, which may be "brushes" FIG. 26 that connect to two conductive rings 59 that are concentric and surround the coupling means A.

Figure 24:
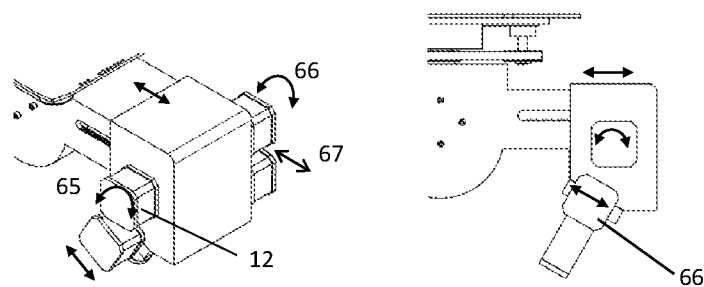
FIG. 24. Device with electron version focus control, with focus modification through convergence angle variation and with focus modification through radial displacement, with perspective views (A) and side views (B).

Control scheme: Once the device is installed in the LINAC head, an external general operating mode control software changes the operating mode allowing the electron dispersing sheet to be removed, so that the electron beam passes freely through the air, which will generate a slight braking of the order of 2% to 5% and electron dispersion that reduces the fluence by 8% to 10%, for a 6 MeV LINAC, in a standard model of a manufacturer. This slight reduction is not significant with respect to the beam at the output of the reduction waveguide of the dispersing sheet FIG. 24.

Figure 25:
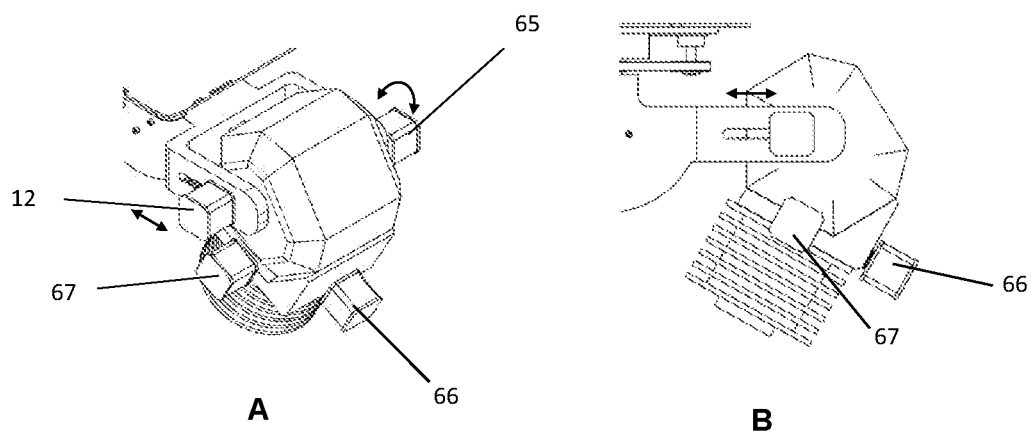
FIG. 25. Device with electron or X-ray photon version focus control, with focus modification through convergence angle variation and with focus modification through radial displacement, with perspective views (A) and side views (B).

Another preferred configuration of the device has an electron braking unit (61), which allows to add rapid cuts of radiation in certain angular positions that follows the first quadrupole which is quick-activating. It has metal sheets, one or more, (62) that close and open magnetically or with one or more quick-acting stepper motors (63) FIG. 25.

One of the most important elements of the technological challenge that allows the success of this invention in its best version and that is ultimately allows it to be coupled to a LINAC in an operating mode, is the deflection capacity of electrons that travel around 96% of the speed of light in the vacuum, in a longitudinal distance of two centimeters. Different types of magnets can generally be used, either electromagnets or permanent magnets. Permanent high-intensity and parallepiped-shaped magnets of reduced dimensions of 2.5×2.0×5.0 cm (the shape and dimensions of the magnets are only by reference and can be different) with a field in surface of 0.6 Tesla were used, however, for a spacing of 10 mm and a length of 2 cm a field close to 1 T is required to have a deflection at the output of the magnets close to 90°. This requirement is impossible to achieve in traditional configurations using iron and between iron as field area. The key is to place the magnets face to face with the opposite poles and make use of the principle of overlapping fields, however, this is very difficult to achieve given the great attraction force close to 200 kg, which is generated when the magnets are only 10 or 8 mm away from each other, to achieve this non-magnetic support pieces (65) were used as shown in FIG. 26 with oblique incidence requires another non-magnetic support (67).

Figure 27:
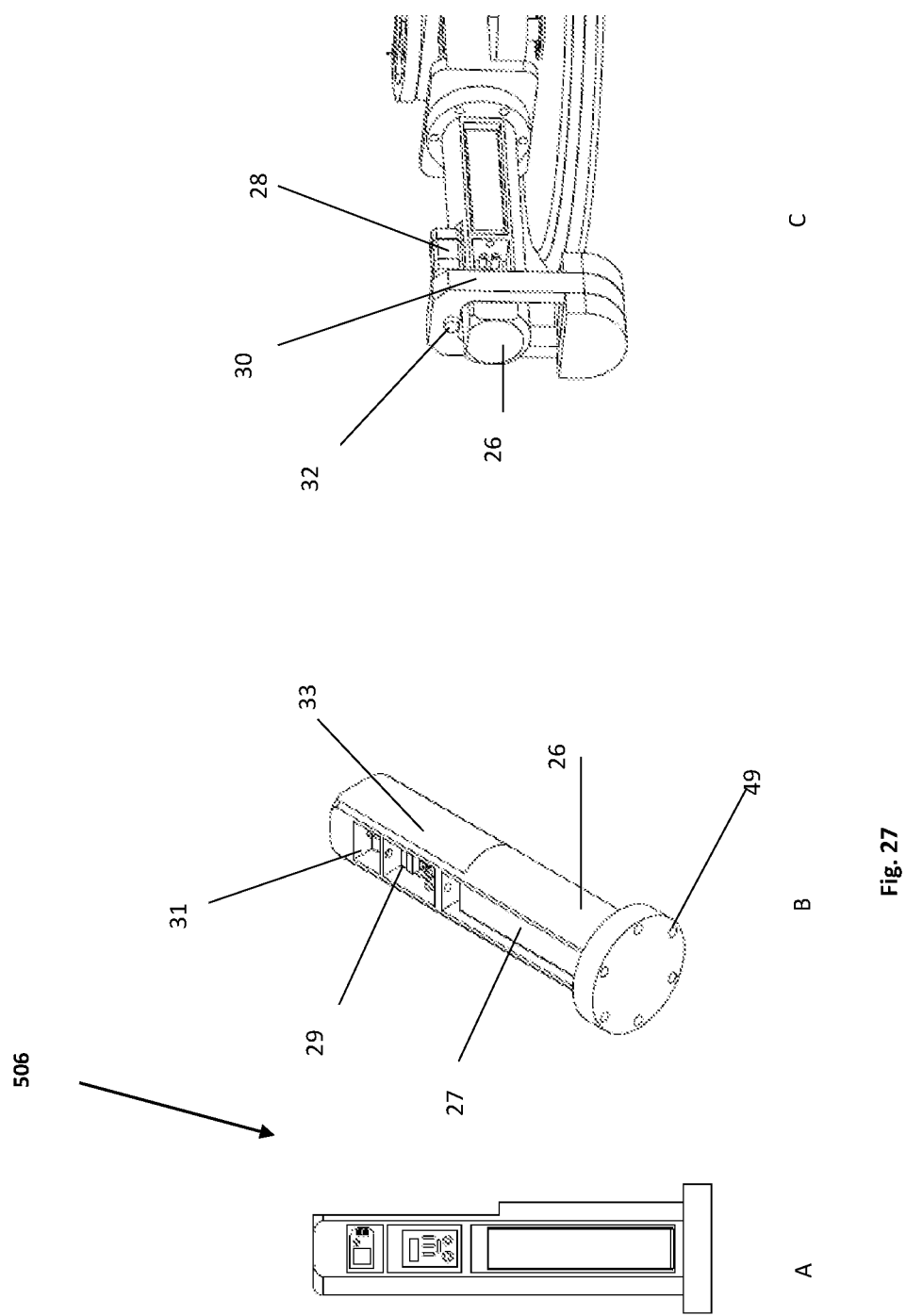
FIG. 27. Support for counterweight with compartments for control electronics of device motors, wireless communication device and battery.
Figure 28:
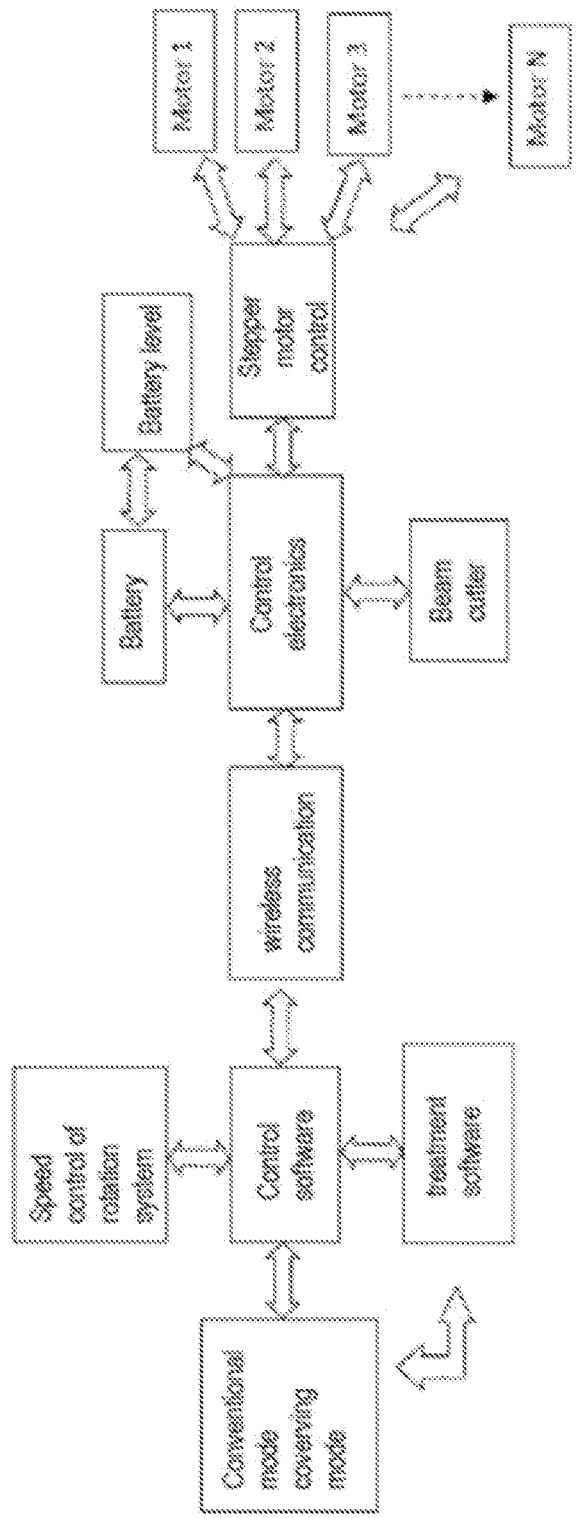
FIG. 28. Scheme of the communication and control system.
Figure 29:
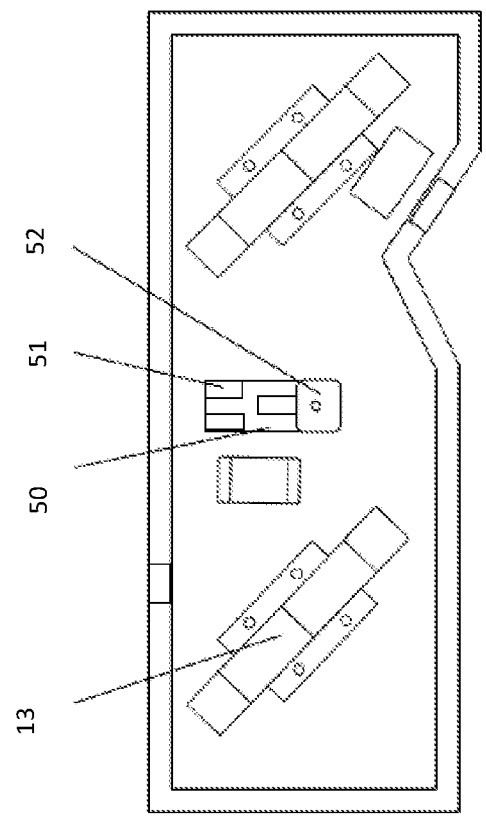
FIG. 29. Diagram of electron beam interruption device.
Figure 30:
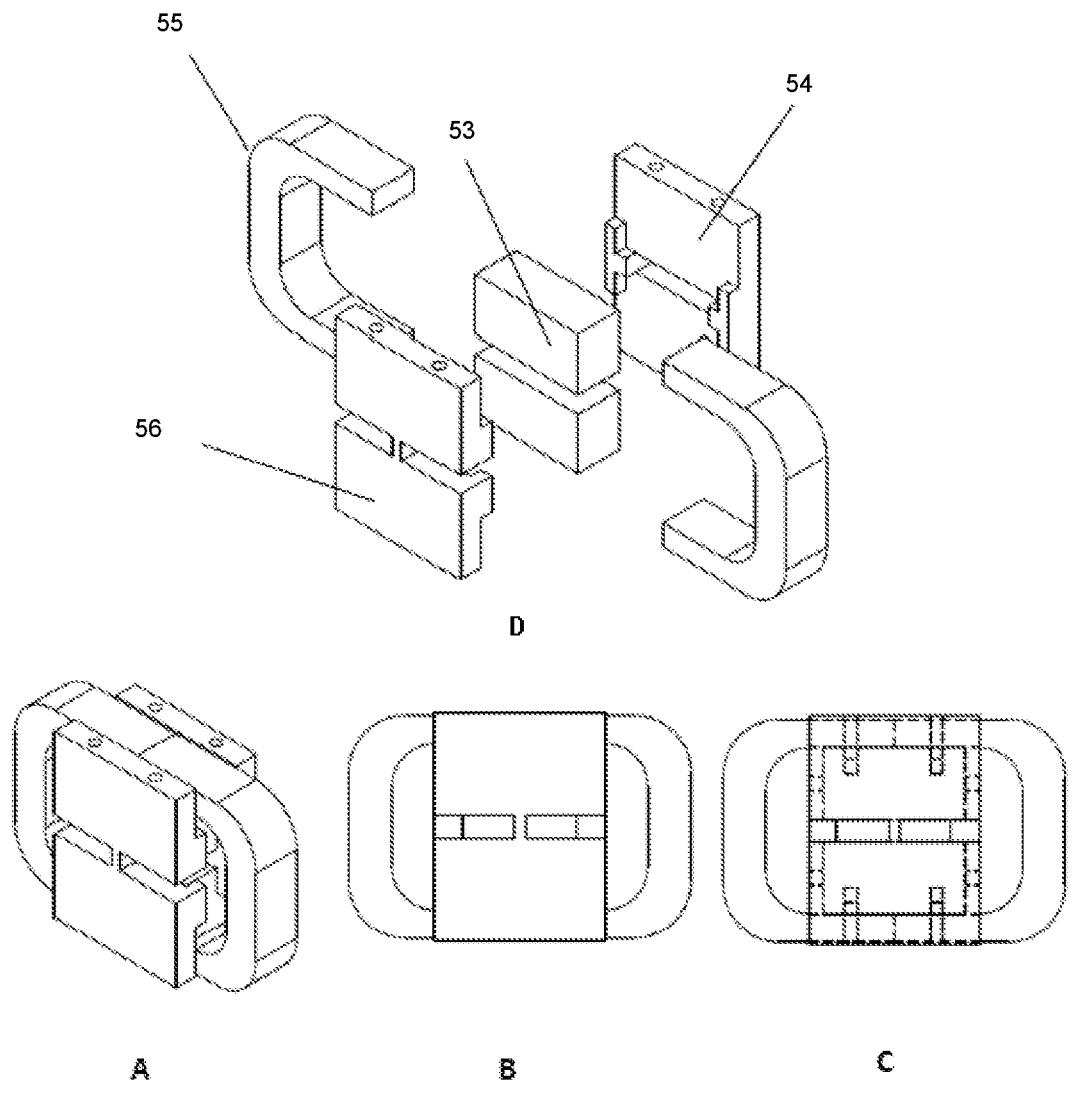
FIG. 30. Permanent magnet with oblique incidence (A: isometric view, B: front view, C: rear view and D: view of an isometric cut).
Figure 31:
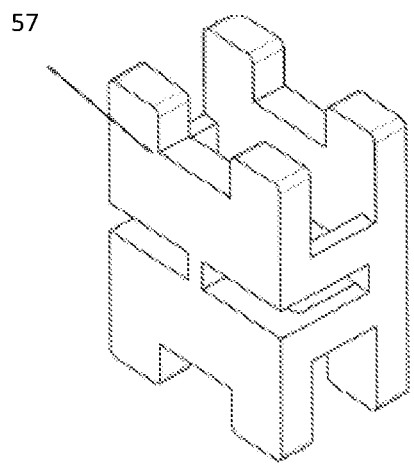
FIG. 31. One-piece permanent magnet holder or monoblock.
Figure 31:
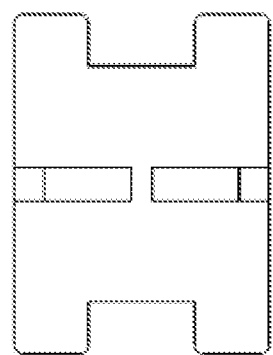
Figure 32:
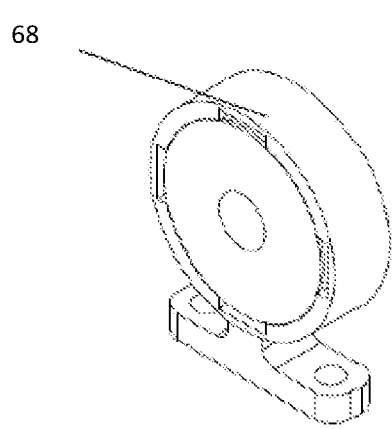
FIG. 32. Magnetic quadrupole detail of permanent magnets.
Figure 32:
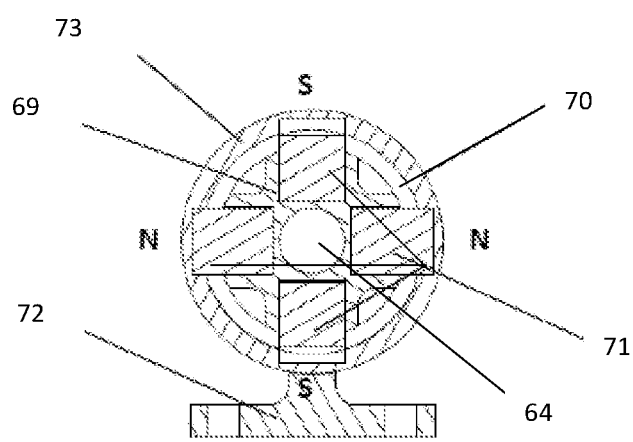

Additionally, other devices for assembling magnets or using magnets are shown, a mono-block permanent magnet holder for placing the permanent magnets of the magnetic deflectors is shown in FIG. 27. FIG. 28 shows the detail of permanent magnet focusing magnetic quadrupole used in this proposal and FIG. 29 shows the detail of a permanent magnet focusing circular magnetic dipole.

Weight and Dimensions: The weight and dimensions of the dimensions of the device are determined by the size and energy of the external radiotherapy equipment to which it could be adapted as the operating energy, typically 6 MeV is a very common energy used in the different types of known accelerators, but it is also possible to work with energy less than 4 MeV, this allows reducing the weight compared to a device working at 6 MeV. For a 6 MeV device, a weight of about 50 kg has been estimated and for a 4 MeV device, this weight could be reduced by about 40 kg, due to the lower amount of material intended to shielding. The outer diameter of the device ranges from 85 to about 30 cm in diameter and approximately 20 cm in length, depending on the outer diameter of the LINAC head of the company being considered. All these dimensions include the shielding that must be used in the target area and its weight only varies depending on the energy according to what is indicated above. Another element that also adds weight to the device is the collimator, the size of this unit is dependent on the energy to be used and its length varies between 4 and 6 cm for 4 and 6 MeV, respectively.

The size and weight can be further reduced if the operating energy of the LINAC can be reduced below 4 MeV and the principle of operation and forms of control of the rotating beam remains the same as described in the previous cases, for all the options described.

DETAILED DESCRIPTION OF PARTS AND VARIANTS

This invention consists of an ionizing radiation fluence concentrator device (500) of varying focus adaptable to a high-energy electron source of an external radiotherapy device with linear accelerator, to focus and guide the focus continuously and less invasively, within a given area, comprising:
- a coupling structure that joins the linear accelerator external radiotherapy device with an outer structure (101), whose central axis (5) is hollow with an input window (6) by which electrons and anchoring means for attaching to the rotation device by clamping means (4);
- a rotation system that is joint to the coupling structure with a coupling flange (8) rotates an inner structure (102);
- an electron deflection system (503) that is in the interior structure (102), wherein the deflection system (503) comprises, a first and a second magnetic deflection device (13, 14);
- a focus control system, which is in the electron deflection system (503), comprising an electronic control system (31) that controls a set of motors (12, 22) that generate coordinated displacements of the second magnetic deflection device (14), a correction element and a collimator (25), which allows to change position of the focal point; and
- at least two laser diodes (74) located at the edge of the collimator (25) pointing towards the focus allowing to determine the generated electron beam position.

In a preferred configuration the coupling structure is a tray (1) with fasteners adapted to the LINAC.

The rotation device comprises; bearings (2) or bushings, a gear belt (9) is connected to a geared motor (10) with the gear of the central axis (7) that is fixed to the coupling structure by bolts (4), the gear belt (9) is tensioned by another pulley (40), with axle slidable to a rail groove (41), which is fixed by bolts or screws (42).

In another preferred configuration, the rotation device is constructed entirely with gears (11), (9) which are connected directly to the geared motor (10) with the central gear (7), wherein the gear (7) is part of the central axis (5), wherein, the mechanism of the rotation device is positioned above the coupling device.

In another preferred configuration, the magnetic electron deflection system (503), is formed by a first magnetic deflection device (13) that deflects the electron beam between 60° and 100° with respect to the direction of the incident electron beam and a second magnetic deflection device (14), of reverse polarity to the first magnetic deflection device (13), deflects the electrons towards a focal point located on the optical axis, which comprise magnets that have a joint intensity between 0.3 T and 1.2 T, wherein, the entire magnetic deflection system (503) is fixed to a support structure (17), wherein some electron beam correction elements (504).

In another preferred configuration, the output of each magnetic deflection device is positioned a trajectory aligning magnetic quadrupole (15, 18) of the trajectory electron beam (18) and/or dipole (74) that aligns the electron beam.

In another preferred configuration, the output of the first magnetic deflection device (13) and/or in front of the first quadrupole (15) is positioned at least one magnetic dipole (74) that focuses the trajectory of the electron beam.

In another preferred configuration, the output of the second magnetic deflection device (14) is positioned a magnetic dipole (74) that focuses the trajectory of the electron beam, wherein, the deflection system (503) lies in a vacuum outer housing (45), which is adapted to the configuration of the magnets, wherein, the first magnetic deflection device (13) is attached to the box inlet wall in a direction perpendicular to the incident electron beam and the second magnetic deflection device (14) is inclined to more than 0°, clockwise, with respect to the first deflection device (13).

The magnetic deflection devices (13, 14) are inclined so that the electron beam emerges from the first magnetic deflection device (13) and deflects in an angle close to 90°, wherein, the magnetic deflection devices (13, 14) are constructed with permanent magnets (64).

In another preferred configuration, the magnetic deflection devices (13, 14) are constructed with electromagnets, wherein, each magnetic deflection device (13, 14) is formed of two magnets (64), wherein each magnet has a magnetic field intensity between 0.2 T and 0.7 T located facing its opposite poles on its polar faces, a non-magnetic lateral support (65), with an elongated hole in the central area, allow positioning the magnets (64) thanks to protrusions that prevent them from joining; C-shaped field closing element (66), located on the sides of the magnets, close the magnetic circuit.

In addition, each of the magnetic deflection devices (13, 14) has a non-magnetic part with a non-magnetic support with central stand (67), so that when the electron beam enters laterally through the area of the central hole of at least one of the magnetic deflection devices (13,14) the beam exits through the same face through which it entered.

On the other hand, quadrupole (15, 18) manufactured with permanent magnets is used.

In addition, the at least one dipole (74) is manufactured with permanent magnets.

The electron beam correction elements (504), comprise quadrupoles (18) and magnetic dipoles (74) based on permanent magnets.

In another preferred configuration, the magnetic deflection devices (13, 14) have an intensity greater than 0.5 T, in another more preferred configuration the magnetic deflection devices (13, 14) have an intensity greater than 1 T.

The shape of the pair of permanent magnets that make up the magnetic deflection devices (13, 14) are of curved and irregular cuts on one of their faces (77, 78).

The magnetic deflection devices (13, 14) have at least one curved field closing element (94), which further comprise a curve at each of their distal ends.

In another preferred configuration, the magnetic deflection devices (13, 14) are electrically energized by a rotary contact (58) that connects it to conductive rings (59) that are connected with the electrical terminals of the head of the external radiotherapy device, in addition it has a non-magnetic S-shaped vacuum electron tube (16) with windows

(68) at its ends. On the other hand, the windows 68 are from beryllium, as it is a light material.

In addition, the windows 68 are heat conductive.

In another preferred configuration, the beam guide has an S-shaped tube (69) or it has a telescopic (70) and cylindrical S-shaped tube or it has a flexible and telescopic tube (72).

In another preferred configuration, the focus control system comprises magnetic deflection devices (13, 14) that are solidly fixed to a support structure (17).

In another preferred configuration, the focus control system comprises a first stepper motor (12) that moves the second magnetic deflection device (14) along a rail (61) of the second magnet linearly displacing the second magnetic deflection device (14) with respect to the rotational axis along the line of the trajectory of the electron beam, wherein the second magnetic deflection device (14) is joined in solidarity with the collimator (25).

In another preferred configuration, the focus control system comprises a second magnetic deflection device (14) rotated by driving a second angular motor (22) and the collimator (25) is angularly displaced by means of a second angular motor (22a) and linearly displaced by means of a linear motor (22L) and the collimator rail (21).

In another preferred configuration, the focus control system comprises a first stepper motor (12) that moves the second magnetic deflection device (14) along a rail of the second magnet (61) linearly displacing the magnetic deflection device (14) with respect to the axis of rotation along the line of the trajectory of the electron beam, wherein the second magnetic deflection device (14) rotates, by driving a second angular motor (22) and the collimator (25) is angularly displaced by means of a second angular motor (22a) and is linearly displaced by means of a linear motor (22L) and the collimator rail (21).

In another preferred configuration, collimator (25) comprises:
a. a septa tube (83) with a septa (84) crossing the collimator;
b. a heat sink (87), which envelops the collimator (25);
c. a radiation attenuator with an attenuation material (85) with a Z greater than 70, which radially envelops the septa tube (83);
d. a white filter disc (19) movable, inserted within said collimator (25) in a side compartment (90) to allow free passage of the electrons, wherein the white filter disc (19) is displaced to the septa (84) to generate X-ray photons.

The collimator (25) further comprises displacement means (89) that translate the white filter disc (19) to one of two positions, which are in the side compartment (90) to allow free passage of the electrons or the septa (84) to generate X-ray photons.

In another preferred configuration, the heat sink (87) is manufactured of materials with thermal conductivity such as aluminum, copper, boron, tin or titanium or broth or alloy thereof.

On the other hand, the heat sink 87 further comprises concentric cylinders 82 that transmit heat homogeneously, outwardly.

On the other hand, the heat sink 87 further comprises dissipation rings 86 for dissipating heat outward.

In another preferred configuration, the displacement means (89) are driven by manual means, such as a peg (92) that moves along the curved groove (91) and is returned by a spring (90).

In another preferred configuration, the displacement means (89) are driven by a motor and a wired or wireless communication means.

The white filter disc (19) is manufactured of tungsten or lead or silver or gold or tin, or alloys thereof.

In another preferred configuration, an external fan for improving thermal dissipation.

On the other hand, a shielding system 507 comprising a head shielding (19) which completely covers the second magnetic deflection device (14), which prevents radiation leakage of X-ray photons.

In another preferred configuration, a counterweight (505) and control system, comprising a support counterweight (26), a stepper motor counterweight (28), a counterweight (30), wireless communication means, a wireless communication compartment (31) with a control compartment (29) for controlling the stepper motors, and battery compartment (27) that energizes all the devices that are in rotation.

The electron deflection system (503) is in an open environment.

In another preferred configuration, a first operation control controls the operation of the LINAC to enable the operation plan, a second control to control the rotation speed and stepper motors that allow the variation of the position of the focus and of the device that cuts the electron beam.

In another preferred configuration, collimator (25) comprises at its distal end an extender element (79), for electron output that minimizes the dispersion of said electrons in the air.

In another preferred configuration, a dosimetric monitoring system (85), which is located at the bottom of the collimator (25) comprising two gas ionization chambers (80) with aluminized windows, to monitor the radiation intensity delivered by the device (500).

In another preferred configuration, the bottom of a support structure (17) is attached to at least two laser guides pointing towards the focus.

LIST OF PARTS COUPLING TRAY

2. Center axis support
3. Bearings (2)
4. Fastening means
5. Center axis
6. Window
7. Center axis gear
8. Coupling flange 9. Gear belt
10. Geared motor
11. Pulley gear motor
12. First Motor L
13. First magnetic deflection device.
14. Second magnetic deflection device.
15. First quadrupole trajectory rectifier
16. S-shaped vacuum electron tube
17. Support structure
18. Second trajectory rectified quadrupole
19. White disc/filter 19a. White disc for electron impact; 19b. Electron filter and heat sink.
20. Head shielding
21. Collimator support base rail
22. Second Motor
23. Collimator support base
24. Collimator holding housing
25. Collimator
26. Counterweight support
27. Battery compartment
28. Counterweight stepper motor 29. Control compartment
30. Counterweight
31. Wireless communication compartment
32. Counterweight screw
33. Counterweight adjustable support 34. Sealed outer casing
35. Counterweight support base
36. Tensioning pulley
37. Fixing screw
38. Groove rail
39. Flange fastening ring
40. Window
41. Outer housing
42. Groove for electron entry
43. Collimator septa
44. Collimator rail base
45. White net disc
46. Electron Filter
47. Rotary contact
48. Conductive rings
49. Weight Compensator Placement Base
50. Dynamic Beam Brake
51. Sheets of metal
52. Solenoid
53. Permanent magnet
54. Side stand non-magnetic support
55. Field closing element
56. Central stand non-magnetic support
57. Beryllium tube windows
58. Fixed S tube
59. Telescopic S tube
60. Flexible and telescopic S tube 61. Second magnet rail
62. Joint element of second magnet with head
63. Positioning laser lights
64. Permanent dipolar magnet
65. Second collimator stepper motor
66. Axis for collimator angular rotation
67. Permanent magnet holder non-magnetic mono-block
68. Quadrupole set
69. Quadrupole support non-magnetic core
70. Field closing ferromagnetic cylinder
71. Four permanent magnets
72. Non-magnetic base
73. Dipole non-magnetic housing
74. Dipole set
75. Permanent toroidal circular magnet
76. Support
77. Deflector magnet 1 with cut
78. Deflector magnet 2 with cut
79. Electron Extender Tube 80. Ionization cameras
81. Shielding for scattered photons of the electron source
82. Conductive concentric cylinders
83. Low-Z septa conductive cylinder (Al)
84. Septa
85. Solid concentric cylinders of shielding material (W or Pb) 86. Ventilation vanes
87. Dissipation system
88. Electron filter
89. Displacement means of white filter disk
90. Side compartment
91. Curved groove of peg
92. Peg
93. Lock
94. Input coupling means
95. Electron input rectangular conical groove
96. Sealing ring
97. Shielding
98. Collimator output coupling means
99. External shielding housing
500. Ionizing radiation fluence concentrator device
501. External structure
502. Interior structure
503. Deflection system
504. Electron beam correction elements
505. Counterweight system

The invention claimed is:

1. An ionizing radiation fluence concentrator device of variable focus adaptative to a high-energy electron source of an external radiotherapy device with linear accelerator, the device comprising:
   a coupling structure adapted to be coupled to an outer structure, the coupling structure comprising an electron window adapted to receive an electron beam;
   a rotation system comprising a hollow central axis adapted to receive the electron beam, the rotation system being coupled to the coupling structure by a fixing means;
   an interior structure coupled to the rotation system, the interior structure adapted to be rotated by the rotation system;
   an electron deflection system disposed in the interior structure, the electron deflection system comprising a first magnetic deflection device adapted to deflect the electron beam and a second magnetic deflection device adapted to deflect the electron beam;
   a focus control system, comprising a set of motors adapted to cause displacements of the second magnetic deflection device, an electronic control system adapted to control the set of motors, and a collimator in a collimation unit adapted to control a position of a focal point; and
   at least two laser guides located at an edge of the collimator and pointing towards the focal point, the at least two laser guides adapted to determine an electron beam position.

2. The device according to claim 1, wherein the rotation device further comprises a geared motor that is fixed to the coupling structure by bolts, wherein the coupling structure is a tray.

3. The device according to claim 1, wherein the first magnetic deflection device deflects the electron beam between 60° and 100° with respect to an incident direction of the electron beam, wherein the second magnetic deflection device is of reverse polarity to the first magnetic deflection device and deflects the electron beam towards the focal point, wherein the electron deflection device comprises magnets that have a joint intensity between 0.3 T and 1.2 T, wherein, the electron deflection system is fixed to a support structure.

4. The device according to claim 1, further comprising electron beam correction elements, wherein an output of each of the first and second magnetic deflection devices is positioned to have a magnetic quadrupole that aligns the electron beam and/or a dipole that aligns the electron beam.

5. The device according to claim 4, wherein at the output of the first magnetic deflection device and/or in front of the magnetic quadrupole at least one first magnetic dipole is positioned that focuses the trajectory of the electron beam and at the output of the second magnetic deflection device at least one second magnetic dipole is positioned that focuses the trajectory of the electron beam.

6. The device according to claim 3, wherein the deflection system lies in a vacuum outer housing, which is adapted to the configuration of the magnets, wherein, the first magnetic deflection device is joined to an inlet wall of the box in a direction perpendicular to the incident direction of the electron beam and the second magnetic deflection device is inclined to more than 0°, clockwise, with respect to the first magnetic deflection device.

7. The device according to claim 3, wherein the first and second magnetic deflection devices are inclined so that the electron beam emerges from the first magnetic deflection device and deflects at an angle close to 90°.

8. The device according to claim 3, wherein the first and second magnetic deflection devices are constructed with permanent magnets or with electromagnets.

9. The device according to claim 1, wherein each of the first and second magnetic deflection devices comprises two magnets, wherein each magnet has a magnetic field intensity between 0.2 T and 0.7 T located facing its opposite poles on its polar faces, a non-magnetic lateral support with an elongated hole in a central area and protrusions adapted to prevent the magnets from joining, and a C-shaped field closing element located on a side of the magnet.

10. The device according to claim 1, wherein each of the first and second magnetic deflection devices has a non-magnetic part with a non-magnetic support with a central stand, wherein when the electron beam enters laterally through an area of the central hole of at least one of the magnetic deflection devices the electron beam exits laterally through the same area through which the electron beam entered.

11. The device according to claim 4, wherein the magnetic quadrupole comprises a quadrupole including permanent magnets and the dipole is based on permanent magnets.

12. The device according to claim 3, wherein each of the first and second magnetic deflection devices includes a pair of permanent magnets having a curved shape and irregular cuts on at least one face.

13. The device according to claim 9, wherein the first and second magnetic deflection devices have at least one magnet having a curved cut field closing element.

14. The device according to claim 1, wherein the focus control system comprises one or more magnetic deflection devices that are fixed relative to a support structure.

15. The device according to claim 1, wherein the focus control system comprises a first stepper motor that moves the second magnetic deflection device along a rail of a magnet linearly displacing the second magnetic deflection device with respect to a rotational axis along a line of a trajectory of the electron beam, wherein the second magnetic deflection device is joined with the collimator wherein the focus control system comprises a second magnetic deflection device rotates by driving a second motor of an angular head and the collimator rotates angularly synchronously by means of another angle of the collimator and linearly displaced by means of a collimator linear motor and a collimator rail.

16. The device according to claim 1, wherein the focus control system comprises a first stepper motor that moves the second magnetic deflection device along a rail displacing the second magnetic deflection device with respect to a rotational axis along a line of a trajectory of the electron beam, a first angular motor that causes the second magnetic deflection device to rotate, and a second angular motor that causes the collimator to be angularly displaced, and a linear motor that causes the collimator to be linearly displaced in a collimator rail.

17. The device according to claim 1, wherein the collimation unit comprises:
collimator and shielding with an attenuation material with a Z greater than 70, which radially envelops a metallic septa tube with low atomic number (Al);
a. a heat dissipation housing that envelops the collimator and provides thermal dissipation;
b. a white filter disc inserted within said collimator in a side compartment to allow free passage of the electrons, wherein the white filter disc is displaced to the septa to generate X-rays; and
c. a head shielding that covers the second magnetic deflection device and is adapted to prevent radiation leakage of X-rays.

18. The device according to claim 17, wherein the collimator further comprises: a white filter disc exchange system having a displacement means that translates the white filter disc to one of two positions in the side compartment to allow free passage of the electron beam or in a central conical hole to generate X-rays, and a heat sink comprising one or more thermally conductive materials, the one or more thermally conductive materials comprising at least one of aluminum, copper, boron, tin, titanium, bronze, or alloys thereof, wherein the heat sink further comprises one of concentric conductive cylinders adapted to transmit heat homogeneously and outwardly, or ventilation rings adapted to dissipate heat outwardly.

19. The device according to claim 17, wherein the white filter disc comprises one of tungsten, lead, silver, gold, tin, or alloys thereof.

20. The device according to claim 1, further comprising an electronics and counterweight support system, comprising a counterweight support, a counterweight stepper motor, a counterweight, a wireless communication means, a wireless communication compartment with an electronic control compartment of the stepper motors, and a battery compartment adapted to provide power to one or more devices.

21. The device according to claim 1, wherein the electron deflection system is in an open environment.

22. The device according to claim 1, further comprising a first operation control adapted to control an operation of a linear electron accelerator (LINAC) to enable an operation plan, a second operation control adapted to control a rotation speed, one or more stepper motors adapted to allow a variation of the position of the focal point and of a device that cuts the electron beam, and a monitoring system of the electron beam the monitoring system being located at a bottom of the collimator and comprising two gas ionization chambers with thin conductive windows (0.1 to 1 mm).

23. The device according to claim 1, wherein collimator comprises at a distal end an electron beam extender tube adapted to minimize a dispersion of electrons in air.

24. The device according to claim 1, wherein the at least two laser guides pointing towards the focal point are attached to a bottom of an external structure joined by a straight bar.

* * * * *